US007830730B2

(12) United States Patent
Miura

(10) Patent No.: US 7,830,730 B2
(45) Date of Patent: Nov. 9, 2010

(54) SEMICONDUCTOR DEVICE

(75) Inventor: Seiji Miura, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 108 days.

(21) Appl. No.: 12/172,956

(22) Filed: Jul. 14, 2008

(65) Prior Publication Data

US 2009/0034349 A1 Feb. 5, 2009

(30) Foreign Application Priority Data

Aug. 1, 2007 (JP) ............................. 2007-200299

(51) Int. Cl.
*G11C 7/10* (2006.01)
(52) U.S. Cl. .............................. 365/189.17; 365/189.2; 365/185.11; 365/185.33; 365/230.01
(58) Field of Classification Search ............ 365/189.17, 365/189.2, 185.11, 185.33, 230.01, 230.03; 711/115, 103, 105
See application file for complete search history.

(56) References Cited

U.S. PATENT DOCUMENTS

| 6,587,393 | B2* | 7/2003 | Ayukawa et al. ....... 365/230.03 |
| 7,373,452 | B2 | 5/2008 | Suh |
| 7,525,855 | B2* | 4/2009 | Kagan .................... 365/189.17 |
| 7,613,880 | B2* | 11/2009 | Miura et al. ................. 711/115 |
| 2002/0185337 | A1 | 12/2002 | Miura et al. |
| 2003/0028733 | A1 | 2/2003 | Tsunoda et al. |
| 2006/0041711 | A1 | 2/2006 | Miura et al. |

FOREIGN PATENT DOCUMENTS

| JP | 2002-366429 A | 12/2002 |
| JP | 2003-91463 A | 3/2003 |

* cited by examiner

*Primary Examiner*—David Lam
(74) *Attorney, Agent, or Firm*—Miles & Stockbridge P.C.

(57) ABSTRACT

A memory module fast in random accesses, large in capacity, and low in fabricating cost. And the memory module can assure high security. The memory module consists of a flash memory, a dynamic random access memory, and a control circuit. The control circuit enables data transfer between the flash memory and the dynamic random access memory only with a read operation for a specific address in the memory module. When reading data from the memory module, the control circuit refreshes the dynamic random access memory. Thus the present invention can realize a large capacity and low cost memory module capable of reading data fast reading and assuring high security.

18 Claims, 25 Drawing Sheets

SEMICONDUCTOR DEVICE

CLAIM OF PRIORITY

The patent application claims priority from Japanese patent application JP 2007-200299 filed on Aug. 1, 2007, the content of which is hereby incorporated by reference into this application.

FIELD OF THE INVENTION

The present invention relates to a semiconductor device, more particularly to a memory system and a memory module that employ a combination of a RAM and a large capacity flash memory respectively.

BACKGROUND OF THE INVENTION

In recent years, application programs have been expanded rapidly in capacity to cope with required processings, typically those of enhanced cellular phones and accordingly, conventional NOR type flash memories have come to be insufficient to meet such required capacities. And instead of those NOR type flash memories, the use of memory modules has been proposed to solve the problem. A memory module, as disclosed in JP-A-2002-366429 and JP-A-2003-091463, consists of a NAND type flash memory, as well as a control circuit that incorporates an SRAM. The NAND type flash memory provides one bit line contact for a unit of 16 to 128 cells, so that the area of one bit memory cell can be smaller than that of the NOR type flash memory. This is why the NAND type flash memory can satisfy the requirement of a larger capacity while its read time required to output the first data is as slow as about 25 µs to 50 µs.

Each of the memory modules disclosed in JP-A-2002-366429 and JP-A-2003-091463 incorporates a RAM and a NAND type flash memory. The memory module realizes a read time of about 80 to 200 ns by transferring data to the RAM from the NAND type flash memory beforehand, then by reading the data from the RAM.

Particularly, according to the technique disclosed in each of JP-A-2002-366429 and JP-A-2003-091463, when transferring data to the RAM from the NAND type flash memory beforehand, the CPU issues a write command to the control circuit, thereby the transfer address and the transfer size are written to a control register provided in the control circuit. The write command instructs the control circuit to write the necessary transfer address and transfer size to the control register.

SUMMARY OF THE INVENTION

Under such circumstances, the present inventor examined non-volatile memory modules used for amusement machines and devices represented typically by arcade game machines, etc. in prior to make this application.

Application programs and data handled by those amusement machines and devices have been expanded in capacity due to the increase of functions having been added thereto just like cellular phones, etc. And accordingly, those application programs and data have come to require larger capacities. They have also required a read time within several 100 ns respectively. Furthermore, they have kept high security of their non-volatile memories by writing data to those non-volatile memories only once at the time of delivery and by disabling writing to the non-volatile memories during ordinary operations.

This means that the conventional NOR type alternative memory that employs the NAND type flash memory disclosed in JP-A-2002-366429 and JP-A-2003-091463 requires writing of data to a control register or the like when in data transfer between the built-in RAM and the AND flash memory. This is why the NOR alternative memory, when employed for amusement machines, cannot assure such high security. In other words, it has been avoided to use such memory modules for amusement machines as long as they start data transfer by writing the data to a control register as described in JP-A-2002-366429 and JP-A-2003-091463, respectively, since those amusement machines have kept assuring high security by disabling writing from external during ordinary operations as described above.

Hereunder, there will be described briefly typical one of the means of the present invention disclosed in this specification.

The typical one of the means of the present invention is a semiconductor device, which includes a random access memory, a non-volatile memory, and a control circuit connected to the random access memory and the non-volatile memory and used to control accesses to those random access memory and non-volatile memory. The semiconductor device further includes a first address area that stores data to be output in response to a read request received from external and a second address area formed outside the first address area. The control circuit, upon receiving a read request from external with respect to the first address area, outputs the requested data from the random access memory and upon detecting a read request issued to the second address area from external, transfers the data read from the non-volatile memory to the random access memory.

The present invention can thus realize a semiconductor device that assures high security.

DETAILED DESCRIPTION OF THE PREFERRED EMBODIMENTS

Hereunder, there will be described a first embodiment of the present invention in detail with reference to the accompanying drawings. Needless to say, unless otherwise specially notified, variations of the first embodiment can apply to other embodiments.

First Embodiment

Figure 1:
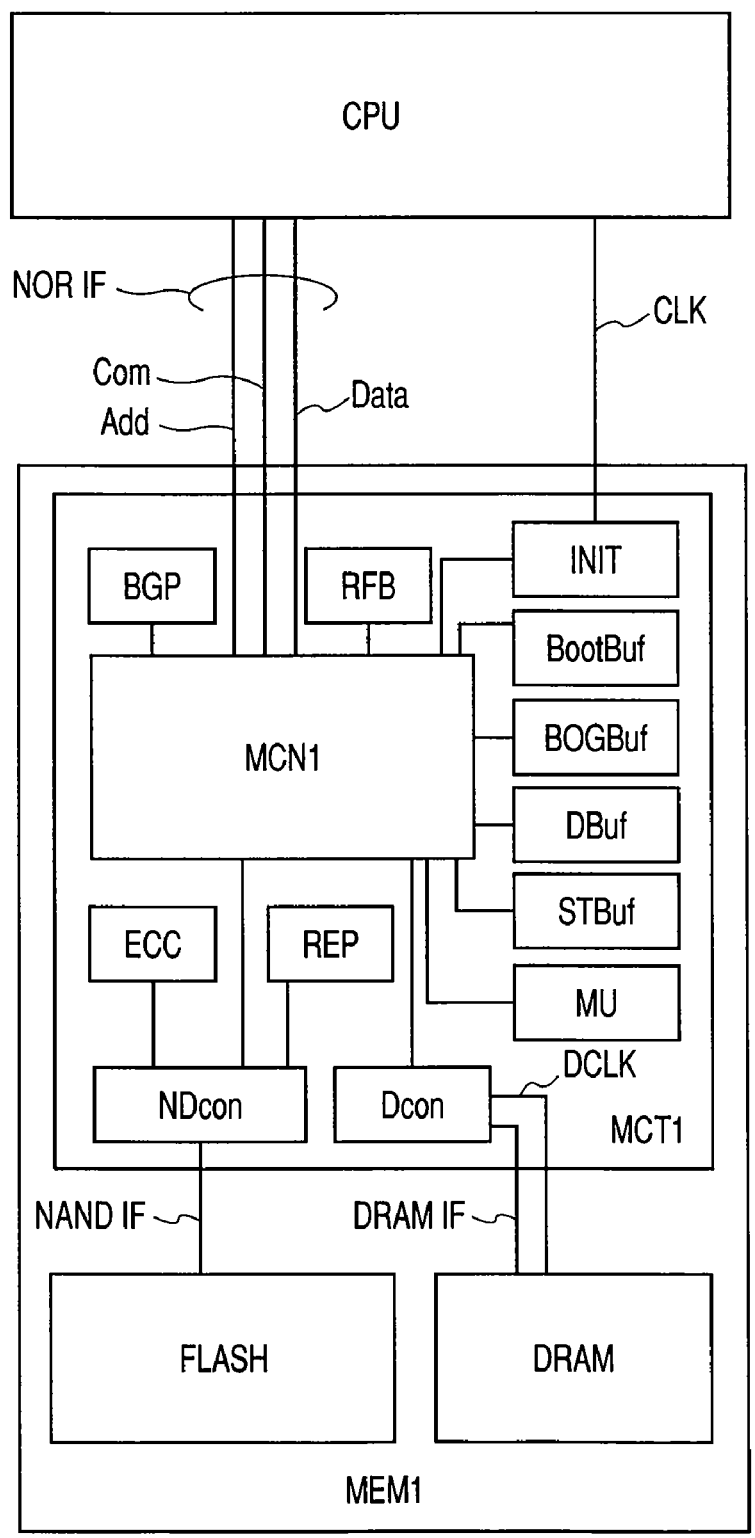
FIG. 1 is a block diagram of a memory system of the present invention.

FIG. 1 shows a block diagram of a memory system consisting of a memory module MEM1 and an information processing unit CPU in this first embodiment.

The memory module MEM1 consists mainly of a non-volatile memory chip FLASH, a dynamic random access memory DRAM, and a control circuit MCT1. The non-volatile memory chip FLASH can be any of a ROM (Read Only Memory), an EEPROM (Electrically Erasable and Programmable ROM), a flash memory, etc. In this first embodiment, it is premised that a flash memory is used as the memory module MEM1. The dynamic random access memory DRAM is roughly classified into asynchronous dynamic random access memories such as EDO and synchronous dynamic random access memories such as SDRAM and DDR-SDRAM according to the difference of the internal configurations and interfaces employed for them. In this first embodiment, it is premised that an SDRAM is used for the memory module, although it can be any of dynamic random access memories of the DRAM type. Additionally, although not specially limited here, the control circuit MCT1 can be any of a microcomputer, a microcontroller, and an ASIC.

The control circuit MCT1 consists of a memory management circuit MU, an access control circuit MCN1, a background presetting circuit BGP, a refresh control circuit RFB, an initialization circuit INT, a boot buffer BootBuf, a background operation buffer BGOBuf, a data buffer DBuf, a status buffer STBuf, a flash memory control circuit NDcon, a dynamic random access memory (DRAM) control circuit Dcon, an error detection/correction circuit ECC, an address replacement circuit REP.

The control circuit MCT1 further includes a NOR type flash memory interface NOR IF, a NAND type flash memory interface NAND IF, and a dynamic random access memory interface DRAM IF. The NAND IF enables data transfer between the control circuit MCT1 and the FLASH. The DRAM IF enables data transfer between the control circuit MCT1 and the DRAM. The NOR IF enables data transfer between the memory module MEM1 and an outside thereof. In this first embodiment, as described above, although existing interfaces are used, other specific dedicated interfaces can also be used. However, if a NOR IF is used for the data transfer between the memory module MEM1 and an outside thereof, the information processing unit (CPU) that is an external master device comes to be used without any modification. Furthermore, if a NAND IF and a dynamic random access interface are used, a general NAND type flash memory and a dynamic random access memory (DRAM) can be used. Consequently, the fabricating cost can be much more reduced than that of a case in which a dedicated large capacity non-volatile memory and a dynamic random access memory (DRAM) are used.

The memory management circuit MU manages whether or not data in an object address in the FLASH is held in the DRAM. Additionally, the memory management circuit MU also manages addresses of the main data area MAIN Area, the boot program area Boot Area, the background area BGArea, and the initial auto load area InLoad provided respectively in the non-volatile memory chip FLASH. Furthermore, the memory management circuit MU manages addresses of the boot buffer BootBuf, the background operation buffer BGOBus, the status buffer STBuf, and the DRAM respectively. The memory management circuit MU selects the boot buffer BootBuf, the background operation buffer BGOBus, the status buffer STBuf, or the DRAM according to the address inputted from the NOR IF.

The access control circuit MCN1 mainly arbitrates and controls accesses from the NOR IF and from the refresh control circuit RFB, and arbitrates and controls the data transfer between the FLASH and the DRAM.

The background presetting circuit BGP stores the procedure data for the background data transfer between the FLASH and the DRAM and the access control circuit MCN1 controls the data transfer between the FLASH and the DRAM according to the procedure data. In this first embodiment, the procedure data is stored in the boot program area BootArea provided in the FLASH. The procedure data can also be written in a masked ROM and preinstalled in the background presetting circuit BGP. The DRAM is required to be refreshed periodically. Otherwise, the data held in the memory cells might be lost. The refresh control circuit RFB thus requests the access control circuit MCN1 for such a refresh operation periodically.

The boot buffer BootBuf holds boot program information stored in the boot program area BootArea of the FLASH. The boot program information includes an initialization program to be started up just after the memory module MEM1 is powered on, as well as a boot program of the information processing unit CPU. The background buffer BGOBuf holds address information, etc. used to carry out data transfer between the FLASH and the DRAM. The data buffer DBuf holds data read from the DRAM or the FLASH temporarily. The status buffer STBuf holds information that denotes the end of data transfer between the FLASH and the DRAM, as well as error information.

The flash memory control circuit NDcon controls the FLASH directly. The DRAM control circuit Dcon controls the DRAM directly.

The initialization circuit INT holds information used to initialize all the circuits in the control circuit MCT1 and the initialization procedure data used to initialize the DRAM just after the control circuit MCT1, the FLASH and the DRAM are powered on. The initialization procedure data can be preinstalled as needed in the initialization circuit INT as a masked ROM. Necessary information other than the information required to access the non-volatile memory chip can be stored in the boot program area BootArea provided in the FLASH. If the initialization procedure data is held in the initialization circuit INT as a masked ROM, however, accesses to the FLASH can be omitted and the FLASH and the DRAM can be initialized simultaneously, thereby the initialization is more quickened.

The error detection/correction circuit ECC checks error existence in each data read from the FLASH and corrects errors if they are detected.

The address replacement circuit REP, if an error is detected in any data read from the [FLASH, replaces the error-detected area with an alternative area prepared in the FLASH. The size of the alternative area is determined so as to assure the reliability of the flash memory.

A clock CLK is inputted from the control circuit MCT1, then inputted to all the circuits in the control circuit MCT1 (not shown in FIG. 1). The clock CLK inputted to the DRAM control circuit Dcon is then inputted to the DRAM.

Figure 2:
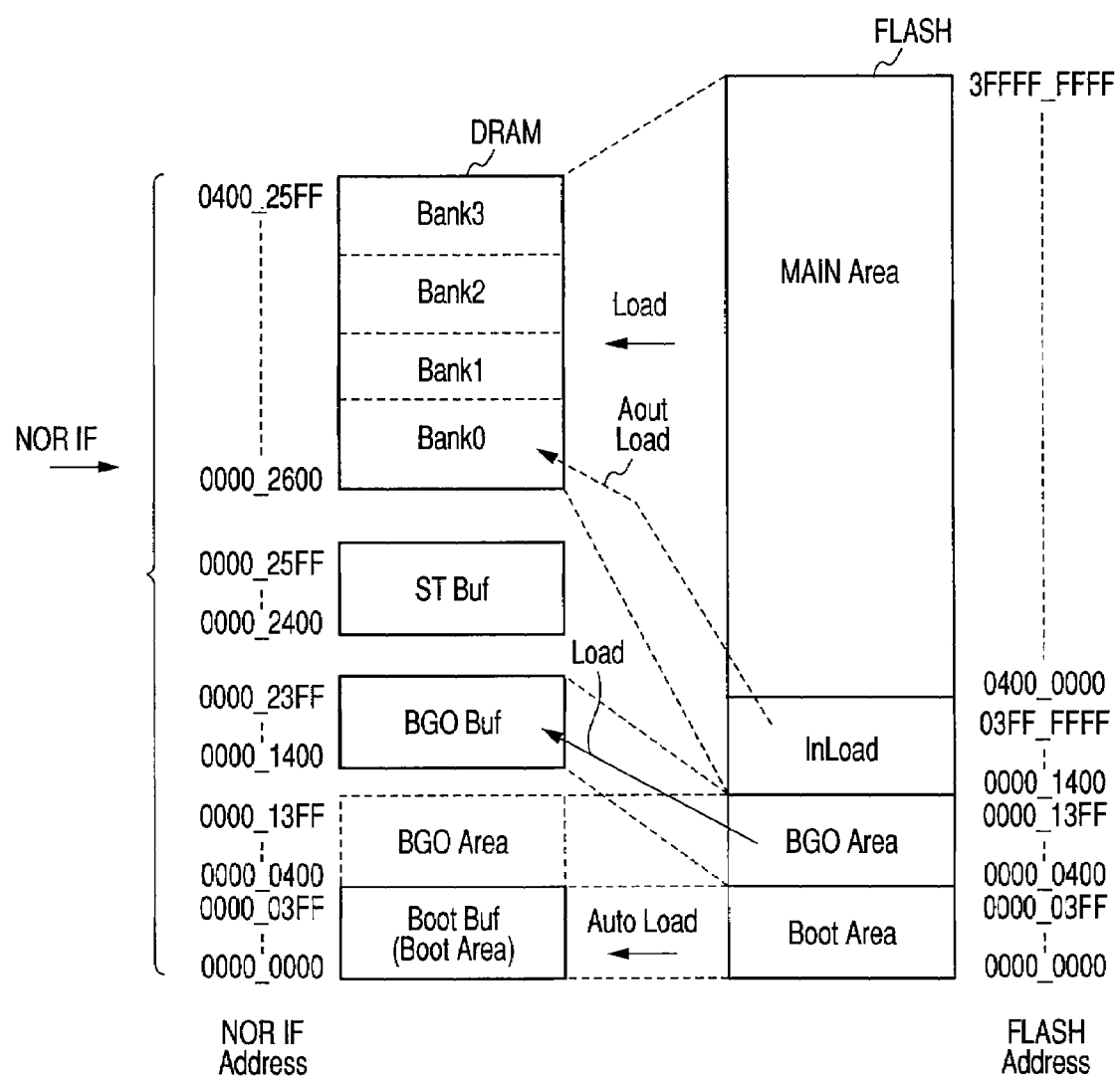
FIG. 2 is a memory map of the memory system of the present invention.

FIG. 2 shows an example of a memory map managed by the memory management circuit MU. Although not limited specially here, it is premised that the memory space is allocated as follows; FLASH: 1 G bytes, DRAM: 64M bytes, boot buffer BootBuf: 16 k bytes, background operation buffer BGOBuf: 4 k bytes, and status buffer STBuf: 512 bytes. The memory capacity of the non-volatile memory chip FLASH is smaller than that of the dynamic random access memory DRAM and needless to say, the sizes of the above memory spaces are just examples respectively. Consequently, the fabricating cost of the random access memory is much reduced. Additionally, in this embodiment, the external CPU accesses the memory module MEM1 within the address space of the NOR IF (Address) shown on the left side in FIG. 2. The address space of the NOR IF (Address) is smaller than that of the FLASH. This is because the capacity of the DRAM is smaller than that of the FLASH. And the address space recognized by the CPU is adjusted to the address space of the FLASH. In this case, the CPU can access the actually program-stored address directly.

To realize this, an address correspondence table should be prepared to denote the source address of each subject data transferred from the FLASH to the DRAM. On the other hand, in this embodiment, the address space recognized by the CPU corresponds to the DRAM from which read is to be read. Consequently, such a transfer data correspondence table (address correspondence table) is not required, resulting in reduction of the fabricating cost.

In the example shown in FIG. 2, the FLASH is divided into a main data area MAIN Area, a boot program area Boot Area, and a background operation area BGOArea. The main data area MAIN Area stores programs and data. Furthermore, the main area MAIN Area includes an initial auto load area InLoad to be transferred automatically from the FLASH to the DRAM at the power-on time.

Although not limited specially here, the address space allocated to the memory module MEM1 managed by the memory management circuit MU is 0000_0000 to 0400_25FF in hexadecimal at the side closer to the NOR IF. The address space is divided and allocated as follows; boot buffer BootBuf (Boot Area): 0000_0000 to 0000_03FF, background operation area BGOArea: 0000_1400 to 0000_23FF, status buffer STBuf: 0000_2400 to 0000_25FF, and DRAM: 0000_2600 to 1000_25FF respectively.

Although not limited specially here, the address space allocated to the memory module MEM1 managed by the memory management circuit MU is 0000_0000 to 3FFF_FFFF in hexadecimal at the side closer to the FLASH. The address space is divided and allocated as follows; main data area MAIN Area: 0000_1400 to 3FFF_FFFF, boot program area Boot Area: 0000_0000 to 0000_03FF, and background operation area BGOArea: 0000_0400 to 0000_13FF respectively. And the address space of the initial auto load area InLoad provided in the main data area MAIN Area is allocated to 0000_1400 to 03FF_FFFF.

Figure 3:
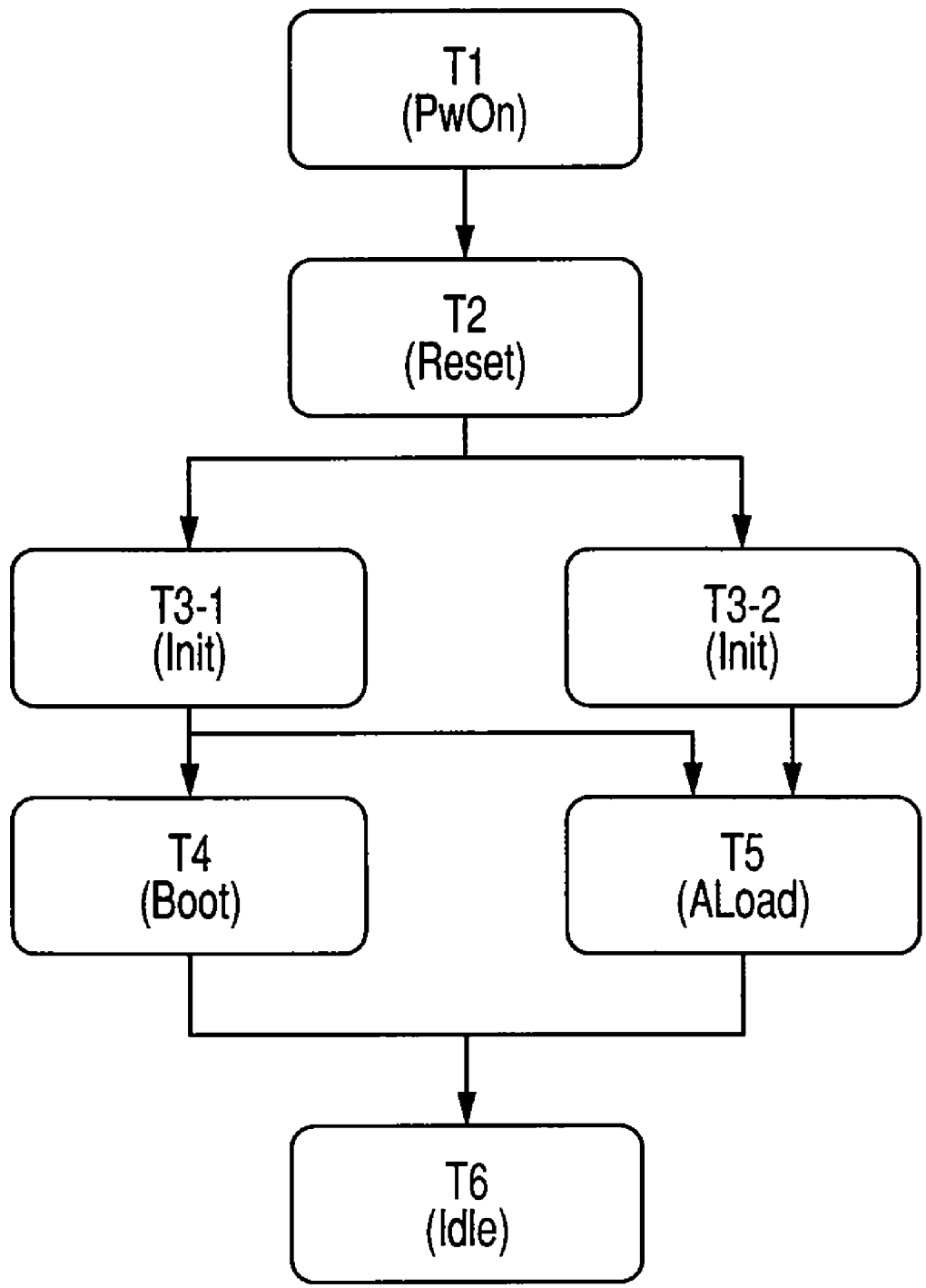
FIG. 3 is a flowchart of the operations of the memory system of the present invention, carried out at a power-on time.

Next, there will be described the operation of the memory module MEM1. At first, there will be described the operation sequence carried out when the memory module MEM1 is powered on. FIG. 3 shows an initialization operation of the control circuit MCT1 carried out when the memory module MEM1 is powered on. The power is turned on in a period T1, then all the circuits in the control circuit MCT1 are initialized in a reset period T2 according to the information held in the initialization circuit INT. The address management information of the memory management circuit MU is initialized in the period T2.

In a period T3, the control circuit MCT1 initializes both the DRAM and the FLASH simultaneously according to the information held in the initialization circuit INT. This means that in a period T3-1 (FLASH initialization), the control circuit MCT1, after initializing the FLASH, instructs the flash memory control circuit Dcon to transfer the boot program, the auto load area specification data, and the background operation procedure data stored in the boot program area BootArea of the FLASH respectively to the boot buffer BootBuf through the NAND IF. Concretely, the control circuit MCT1 issues a read command to the flash memory control circuit Dcon according to the initialization procedure stored in the initialization circuit INT and the flash memory control circuit Dcon reads the object data from the boot program area BootArea in the FLASH in response to the read command. After this, the error detection/correction circuit ECC checks the data for error existence. If no error is detected in the read boot program and in the auto load area specification data, the read program and data are transferred to the boot buffer BootBuf through the control circuit MCT1. If any error is detected in the read program and data, the circuit ECC corrects the error, then they are transferred to the boot buffer BootBuf through the control circuit MCT1. The control circuit MCT1 initializes both the FLASH and the DRAM simultaneously in such a way according to the initialization procedure stored in the initialization circuit INT (T3-2). During this period (T3-2), a refresh operation is also carried out. The access control circuit MCN1, upon receiving a refresh request included in the initialization procedure held in the initialization circuit INT, carries out a refresh operation for the DRAM through the DRAM control circuit Dcon.

In a period T4, the CPU reads the boot program from the boot buffer BootBuf to start up and initialize itself. The boot program held in the BootBuf is transferred beforehand from the boot program area Boot Area of the FLASH. Thus the CPU is not required to access the DRAM, so the CPU can carry out the initialization after exiting the T3-1 period. After completing the processings in the periods T3-1 and T3-2, the control circuit MCT1 transfers the data read from the FLASH to the DRAM according to the auto load area specification data read from the boot buffer BootBuf (T5 period). This processing is carried out simultaneously with the processing in the period T4. Concretely, the control circuit MCT1 reads the background operation procedure data from the buffer BootBuf and transfers the read data to the background presetting circuit BGP, then sets the data transfer procedure required for the data transfer from the FLASH to the DRAM. After this, the control circuit MCT1 reads the auto load area specification data from the boot buffer BootBuf according to the data transfer procedure transferred to the background presetting circuit BGP, then reads the data sequentially within the range denoted by this data from the FLASH through the flash memory control circuit Dcon. The MCT1 transfers the read data to the data buffer DBuf. The data transferred to the data buffer DBuf is read by the control circuit MCT1, then transferred to the DRAM through the DRAM control circuit Dcon. When the data transfer to the DRAM is completed, the control circuit MCT1 writes a transfer completion flag denoting the completion of the data transfer in the status buffer STBuf to exit the initialization operation. After this, the memory module MEM1 goes into the idle state in the period T6.

The CPU accesses the status buffer STBuf through the NOR IF to read the transfer completion flag, thereby the CPU can know the completion of the data transfer carried out just after the power-on. When using a special interface instead of the NOR IF, the CPU can know the completion of the data transfer through a leased line or the like. In such a way, because necessary data can be transferred automatically from the FLASH to the DRAM while the CPU is started up, the CPU can access the memory module MEM1 just after it is started up. The performance of the memory module MEM1 can thus be improved. In this embodiment, although processings that can be carried out in parallel are all carried out in parallel, the description is not limited only to this method. For example, all the processings can be carried out sequentially and only some of them can be carried out in parallel. However, processings that can be carried out in parallel should preferably be carried out in parallel to make the CPU go into the idle state quickly, even though the controlling might be complicated.

Next, there will be described an example of data transfer between the FLASH and the DRAM with reference to FIGS. 1 and 2. The data transfer is carried out after completion of the power-on time operation sequence.

In part of the address space allocated to the FLASH by the memory management circuit MU is provided a background operation area BGOArea as described above. The access control circuit Mcon1 inputs a read command with respect to this background operation area BGOArea, as well as an address denoting this BGOArea from the CPU and other devices through the NOR IF. The CPU is a master device. And an access to this BGOArea is assumed as a trigger for the data transfer from the FLASH to the DRAM. The access control circuit MCN1, upon detecting a read request issued to this BGOArea, reads object data from the BGOArea provided in the FLASH through the flash memory control circuit Dcon according to the background operation preset data stored in the background presetting circuit BGP. This data includes a data transfer starting address, a data transfer size, etc. required for the data transfer from the FLASH to the DRAM. This read data is then subjected to error detection/correction to be carried out in the error detection/correction circuit ECC. The read data is then written in the background operation buffer BGOBuf through the flash memory control circuit Dcon and the access control circuit MCon1 respectively, then held therein. After this, the access control circuit MCN1 reads the data transfer starting address and the data transfer size from the background operation buffer BGOBuf and enables the data transfer from the FLASH to the DRAM. After completing the data transfer, information of the data transfer completion is written in the status buffer STBuf.

As described above, after completing the power-on time operation sequence carried out when the memory module MEM1 is powered on, ordinary accesses are enabled as follows. The data transfer between the FLASH and the DRAM is started when the CPU issues a read request to the background operation area BGOArea provided in the FLASH through the NOR IF. Consequently, only a read operation is required to realize the data transfer from the FLASH to the DRAM; no write operation from the NOR IF is required.

Next, there will be described read and data transfer operations with reference to the flowchart shown in FIG. 4. At first, the CPU sends a read command and an address to the access control circuit MCN1 through the NOR IF of the memory module MEM1 (step 1 in FIG. 4). Then, the access control circuit MCN1 checks whether or not the inputted address is within the address space of the background operation area BGOArea according to the address management information received from the memory management circuit MU to (step 2 in FIG. 4).

Figure 4:
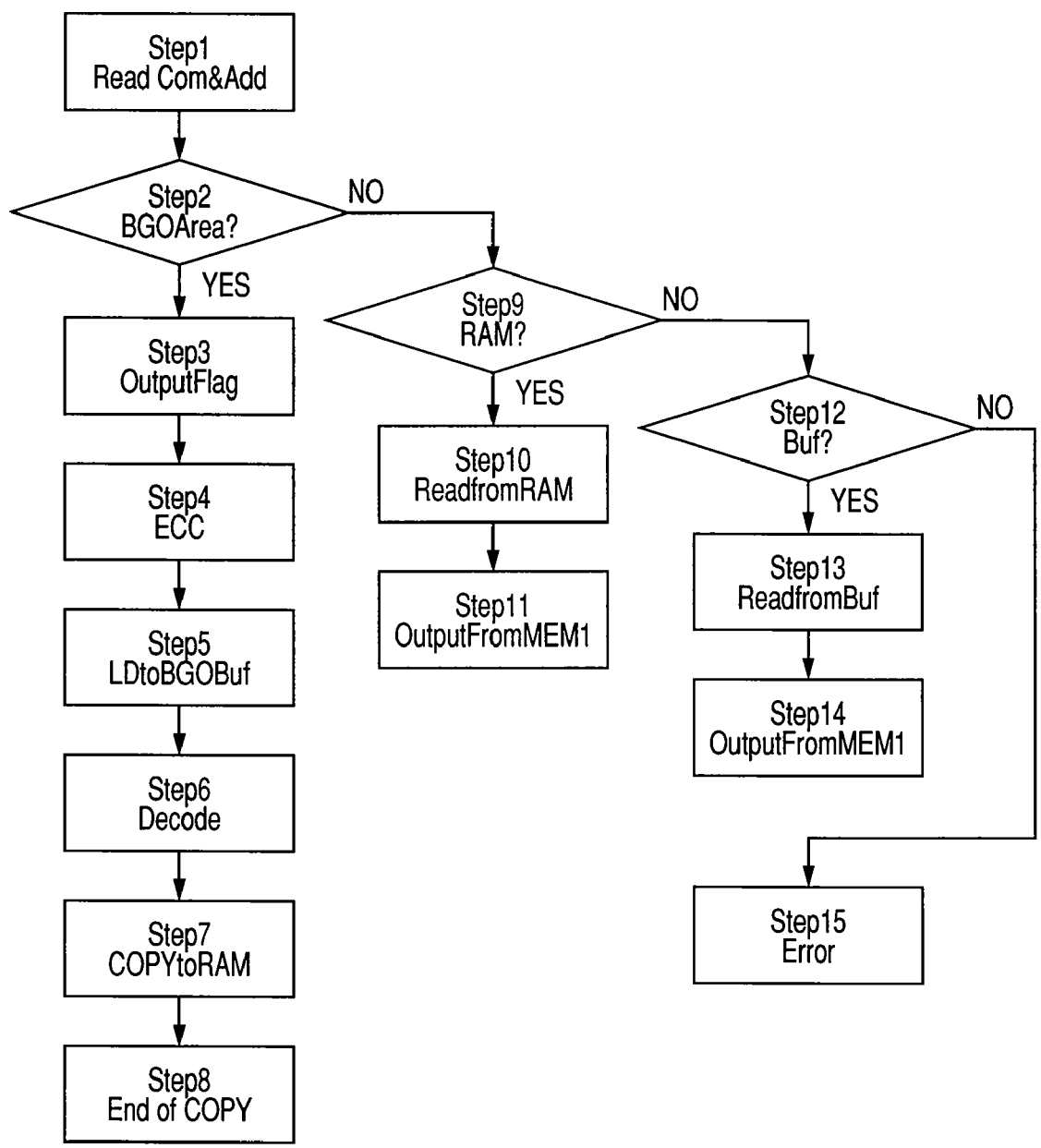
FIG. 4 is a flowchart of data read operations carried out in the memory system of the present invention.

If the input address value is within the address space of the BGOArea, the access control circuit MNC1 outputs the data denoting completion of acceptance of an access to the BGOArea through the data signal line Data of the NOR IF (step 3 in FIG. 4). Consequently, the CPU comes to know that the read command addressed to the BGOArea is accepted. If there is no need to output the access acceptance completion data to the CPU, the access control circuit MNC1 does not output any specific data. In such a case, the CPU's read access is not ended, so a special operation might be required in the CPU sometimes. To avoid this, the CPU should preferably output any dummy data, even though it is not such a special one as the access acceptance completion data. If the input address value is within the address space allocated to the background operation area BGOArea, the memory module MEM1 reads the background transfer procedure from the background operation presetting circuit BGP so as to go to a step for carrying out transfer data from the FLASH to the DRAM (hereinafter, to be referred to as background transfer).

Hereinafter, the access control circuit MCN1 controls the background transfer according to the transfer procedure data. Concretely, the access control circuit MCN1 reads necessary data from the background operation area BGOArea provided in the FLASH through the flash memory control circuit Dcon (step 4 in FIG. 4). Although not limited specially here, this data includes the data transfer start address of the source, data transfer start address of the destination, data transfer size, etc. required to carry out the data transfer to the DRAM from the FLASH. This read data is then transferred to the error detection/correction circuit ECC for error detection/correction (step 5 in FIG. 4). After the error check and correction in the circuit ECC, the read data is written in the background buffer BGOBuf through both the flash memory control circuit Dcon and the access control circuit MCN1, then held therein (step 6 in FIG. 4).

After this, the access control circuit MCN1 reads necessary data from the background operation buffer BGOBuf to decode the start address of the transfer source, start address of the transfer destination, data transfer size (step 6 in FIG. 4) and enables the data transfer to the DRAM from the FLASH according to the decoding result. When reading data from the FLASH, the read data is subjected to the error detection/correction circuit ECC as described above, so errors detected in the circuit ECC are corrected there (step 7 in FIG. 4). After completing this data transfer, the memory management circuit MU updates the address management information corresponding to the address of the data transferred from the FLASH to the DRAM. Additionally, a transfer completion flag denoting completion of the subject data transfer is written in the status buffer STBuf (step 8 in FIG. 4).

Consequently, the CPU can also know the completion of data transfer just after the power-on by accessing the status buffer STBuf through the NOR IF and by reading the transfer completion flag.

In this embodiment, information of the data transfer to the DRAM from the FLASH is stored beforehand in the background operation area BGOArea that is part of the FLASH as described above. And each read access to the area is detected to carry out object background transfer. Consequently, no write operation from the NOR IF is made; only a read operation is required for the data transfer from the FLASH to the DRAM. The data transfer security is therefore much improved.

Next, there will be described data reading from the DRAM through the NOR IF.

At first, the CPU sends a read command and an address to the address control circuit MCN1 through the NOR IF of the memory module MEM1 (step 1 in FIG. 4).

Then, the access control circuit MCN1 checks whether or not the received address is within the address space allocated to the BGOArea according to the address management information received from the memory management circuit MU (step 2 in FIG. 4).

If this address value is not within the address space, the access control circuit MCN1 then checks whether or not this received address value is within the address space allocated to the DRAM according to the address management information received from the memory management circuit MU (step 9 in FIG. 4). If this received address value is within the address space allocated to the DRAM, the access control circuit MCN1 reads the desired data from the DRAM and transfers the read data to the data buffer DBuf through the control circuit MCT1 (step 10 in FIG. 4). After this, the data in the data buffer DBuf is output to the CPU through the NOR IF (step 11 in FIG. 4).

Next, there will be described how the NOT IF reads data from the status buffer STBuf, the background operation buffer BGOBuf, and the boot buffer BootBuf respectively. The background operation buffer BGOBuf is allocated to the addresses that are different from those of the BGOArea. Therefore, the NOR IF is enabled to read data from the background operation buffer BGOBuf.

At first, the CPU sends a read command and an address to the access control circuit MCN1 through the NOR type flash memory interface NOR IF of the memory module MEM1 (step 1 in FIG. 4).

Then, the access control circuit MCN1 checks whether or not the received address value is within the address space allocated to the BGOArea according to the address management information received from the memory management circuit MU (step 2 in FIG. 4).

If the received address value is not within the address space, the access control circuit MCN1 checks whether or not the value is within the address space allocated to the DRAM according to the address management information received from the memory management circuit MU (step 9 in FIG. 4). If the address value is not within the address space, the access control circuit MCN1 further checks whether or not the value is within the address space allocated to any of the status buffer STBuf, the background operation buffer BGOBuf, and the boot buffer BootBuf (step 12 in FIG. 4).

If the address value is within the address space allocated to the status buffer STBuf, the access control circuit MCN1 reads the desired data from the status buffer STBuf. If the address value is within the address space allocated to the background operation buffer BGOBuf, the access control circuit MCN1 reads the desired data from the buffer BGOBuf. And if the address value is within the address space allocated to the boot buffer BootBuf, the access control circuit reads the desired data from the buffer BootBuf and transfers the read data to the data buffer DBuf through the control circuit MCT1 respectively (step 13 in FIG. 4). After this, the data in the data buffer DBuf is output to the CPU through the NOR IF (step 14 in FIG. 4).

If the received address value is not within the address space allocated to any of the status buffer STBuf, the background operation buffer BGOBuf, and the boot buffer BootBuf, the control circuit regards it as an error and the error information is output to the CPU through the NOR IF (step 15 in FIG. 4).

As described above, according to the read command and the address received from the CPU, the memory module MEM1 enables background transfer, data output from the DRAM, and data read from various buffers. Consequently, writing from the CPU is omitted, thereby the memory module MEM1 can realize high security.

Note that the description has been made sequentially for the processings in three steps (steps 2, 9, and 12) to determine the access destination area denoted by each input address in FIG. 4. Actually, however, the processings in those three steps are carried out simultaneously.

Next, there will be described how to read data from the DRAM in detail with reference to FIGS. 5 through 8. The DRAM is required to be refreshed periodically so as to keep the data held in the memory cells. In this embodiment, the refresh control circuit RFB provided in the memory module MEM1 issues refresh requests to prompt such refresh operations periodically. Thus no refresh requests from external are required and the interface of the memory module MEM1 is compatible with the NOR IF. This means that the refresh operations of the DRAM are hidden to realize a NOR IF compatible, low cost, and large capacity random access memory.

Figure 5:
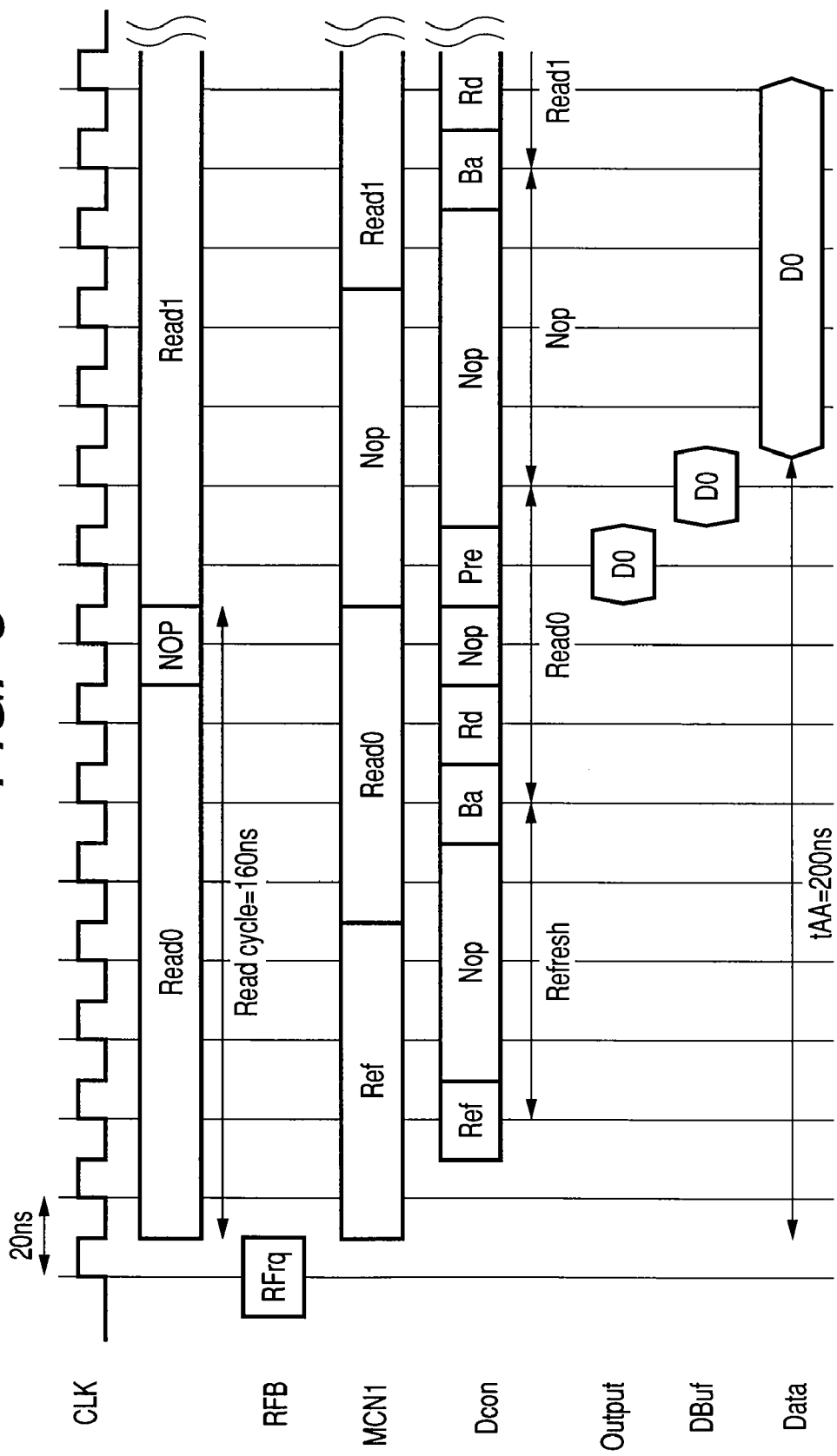
FIG. 5 is a timing chart of random read accesses to the memory system of the present invention.

FIG. 5 shows a diagram that describes how the memory module MEM1 acts when random read accesses (Read0 and Read1) are made consecutively from the BOR IF in a period of 160 ns while the DRAM is refreshed. Here, there will be described two cases; in one case, a refresh operation is carried out and in the other, no refresh operation is carried out.

Upon receiving a read access (Read0) from the NOR IF, the address inputted to the access control circuit MCN1 through an address signal line Add is divided into a row address and a column address in the DRAM control circuit Dcon. Furthermore, the access control circuit MCN1 determines whether the access is a random read access or a page read access. In other words, if the row address changes, the access control circuit MCN1 regards the access as a random access and if only the column address changes, the access control circuit MCN1 regards the access as a page read access.

In case of a random access, the refresh control circuit RFB issues a refresh request (RFrq) to the access control circuit MCN1. The access control circuit MCN1 then sends a refresh request (Ref) in the first 80 ns period and a read request (Read0) in the next 80 ns period to the DRAM control circuit Dcon respectively. If a refresh request from the refresh control circuit RFB is received before receiving a random read access from the NOR IF, the DRAM carries out the refresh operation first. If the refresh request is received simultaneously with or after receiving the random read access from the NOR IF, the DRAM carries out the read operation first, then carries out the refresh operation.

At first, the DRAM control circuit Dcon issues a refresh command (Ref) to the DRAM, then issues an activation command (Ba), a read command (Rd), and a precharge command (Pre) to the DRAM sequentially.

Then, the DRAM carries out the refresh operation in response to the refresh command (Ref). After this, the DRAM carries out the read operation (READ0) according to the activation command (Ba), the read command (Rd), and the precharge command (Pre) in response to the random read access.

The data D0 read from the DRAM is output from the data signal line Data of the NOR IF through the data buffer DBuf.

In case of the read access (Read1), the DRAM receives no refresh request from the refresh control circuit RFB, so the DRAM carries out no refresh operation, but carries out a read operation as usually.

As described above, the random read access cycle time of 160 ns includes a read cycle time of 80 ns and a refresh operation can be carried out in the memory module MEM1 in the remaining read cycle time of 80 ns. This means that the read operation from the NOR IF is enabled while the refresh operation in the DRAM is hidden. Because the refresh operation in the DRAM is hidden in such a way, the CPU can access the memory module MEM1 through the existing NOR IF. Although not limited specially here, the refresh operation hiding can be made without causing any troubles such as an access delay, etc. if it is carried out within a read cycle time just like in this embodiment. And such refresh operations are not necessarily required to be hidden if an external interface is used as a special interface or dynamic random access interface.

Figure 6:
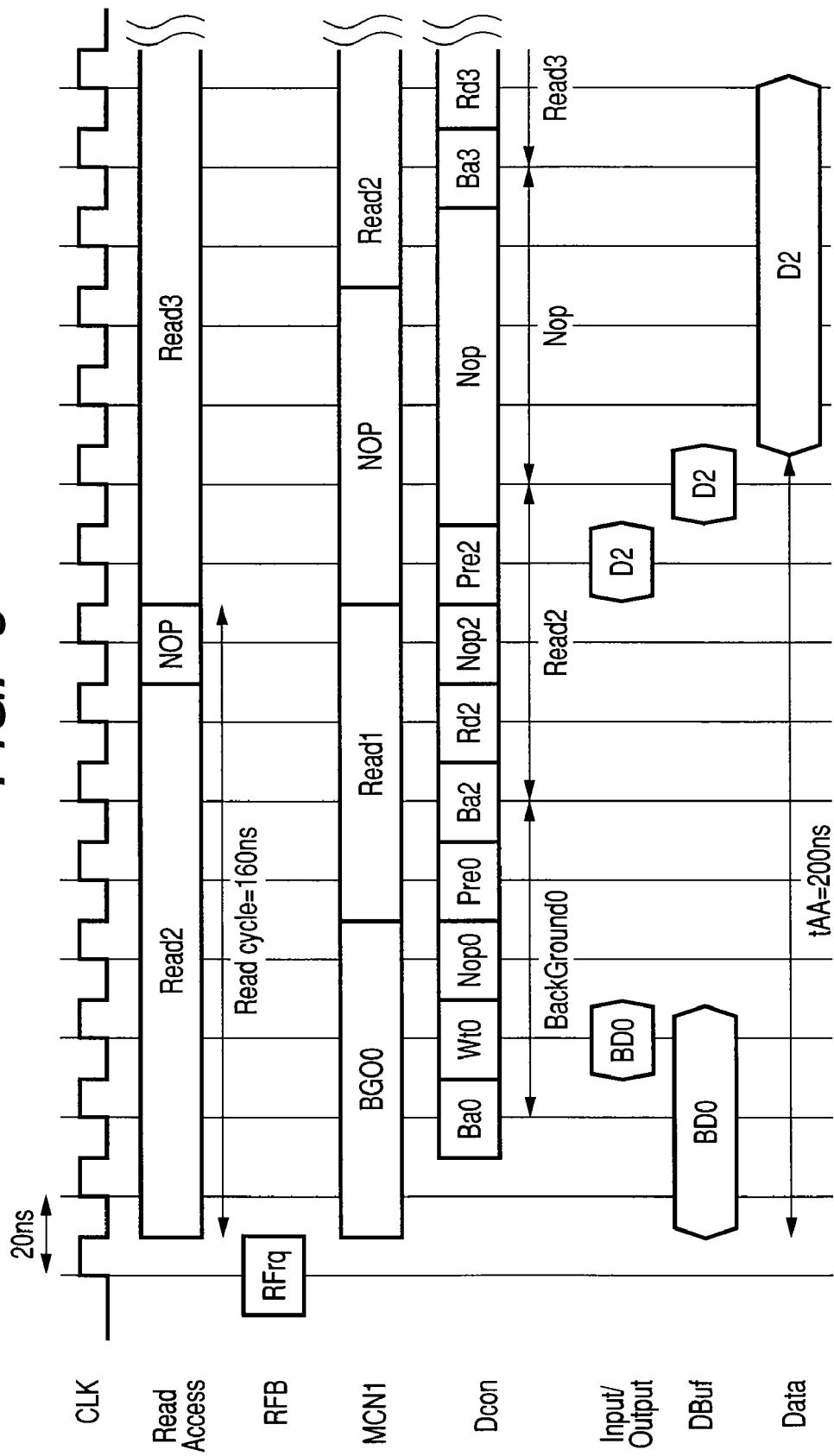
FIG. 6 is another timing chart of random read accesses to the memory system of the present invention.

FIG. 6 shows a diagram that describes the operation of the memory system of the present invention to cope with consecutive random read accesses (Read2 and Read3) received from the NOR type flash memory interface NOR IF in a cycle time of 160 ns while background data is transferred. In this embodiment, it is premised that the last background data transfer data is written in the DRAM in the read access (Read2) In case of the read access (Read0) from the NOR IF, the address is inputted to the access control circuit MCN1 from the address signal line Add, then the address is divided into a row address and a column address there.

The access control circuit MCN1 transfers object background data (BGO0) in the first 80 ns and a read request (Read2) in the next 80 ns to the DRAM control circuit Dcon respectively. Then, the DRAM control circuit Dcon issues an activation command (Ba0), a write command (Wt0), and a precharge command (Pre0) to the DRAM, then an activation command (Ba2), a read command Rd2, and a precharge command (Pre2) to the DRAM sequentially. In response to the write command (Wt0), the object data BD0 is read from the non-volatile memory chip FLASH, stored in the data buffer DBuf, and written in the DRAM.

The memory system carries out the read operations according to the activation command (Ba2), the read command (Rd2), and the pre-charge command (Pre2) in response to the random read access.

The data D2 read from the DRAM is output from the data signal line Data of the NOR IF through the data buffer DBuf.

As described above, the random access read cycle time of 160 ns includes a read cycle time 80 ns and a write operation can be carried out in the memory module MEM1 in the remaining 80 ns. This means that the background data transfer to the DRAM from the non-volatile memory chip FLASH is hidden, thereby reading from the NOR IF is enabled.

Figure 7:
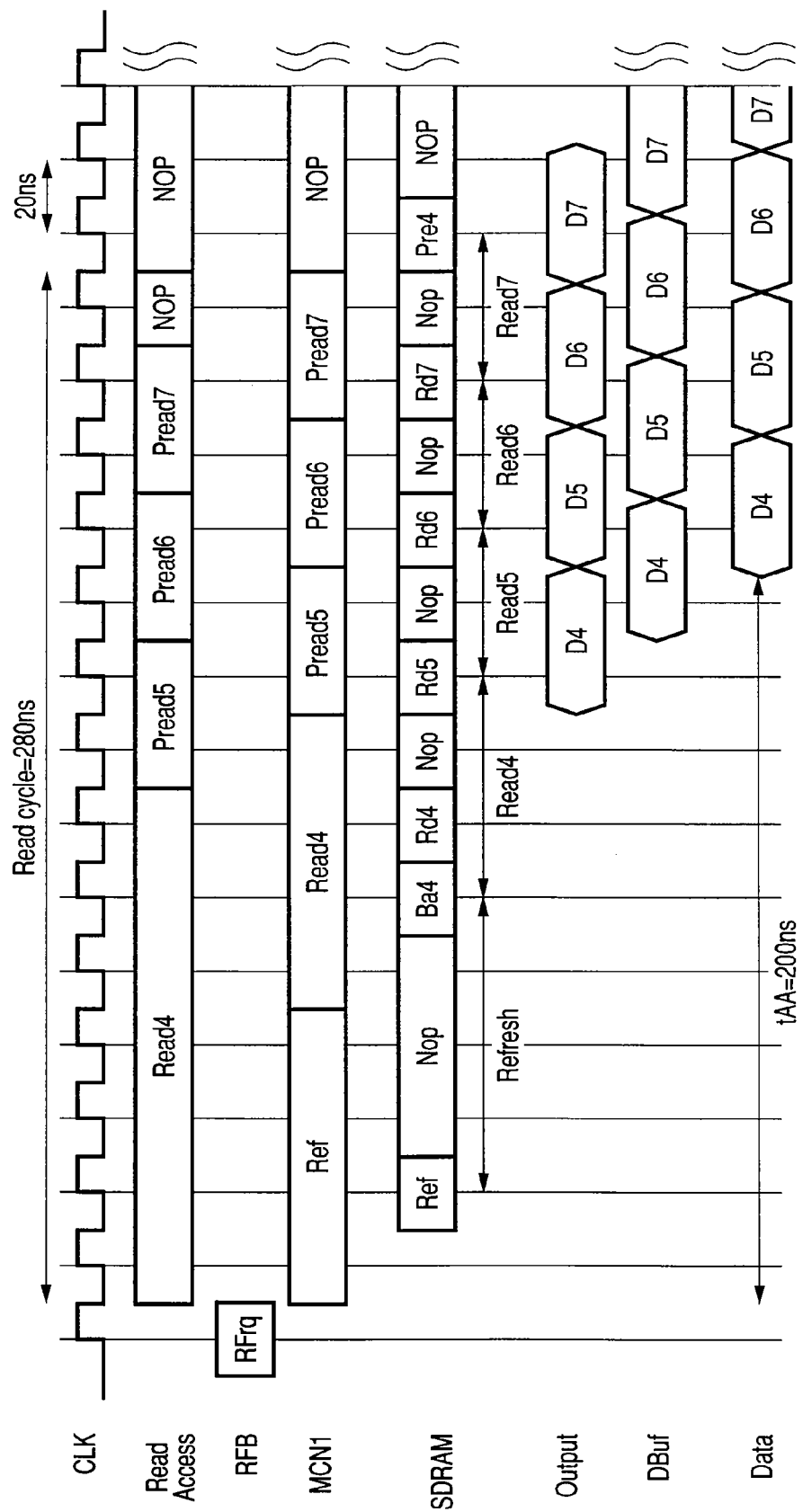
FIG. 7 is a timing chart of page read accesses to the memory system of the present invention.

FIG. 7 shows a diagram that describes the operation of the memory system of the present invention to cope with consecutive page read accesses (Read4, Read5, and Read6) received from the NOR IF in a period of 280 ns during a refresh operation.

In case of a read access (Read0) from the NOR IF, the address inputted to the access control circuit MCN1 through the address signal line Add is divided into a row address and a column address in the DRAM control circuit Dcon. Furthermore, the access control circuit MCN1 determines whether the access is a random read access or a page read access. If the row address changes, the access control circuit MCN1 regards the access as a random read access and if only the column address changes, the circuit MCN1 regards the access as a page read access.

If the read access (Read4) is a random read access, the refresh control circuit RFB issues a refresh request (RFrq) to the access control circuit MCN1. The access control circuit MCN1 then sends a refresh request (Ref) in the first 80 ns and a read request (Read4) in the next 80 ns to the DRAM control circuit Dcon respectively.

After this, the DRAM control circuit Dcon issues a refresh command (Ref) to the DRAM first, then an activation command (Na4) and a read command (Rd4) to the DRAM respectively.

Thus the DRAM carries out a refresh operation in response to the refresh command. Then, the DRAM carries out the activation command (Na4) and the read command (Rd4) in response to the random read access.

The data D4 read from the DRAM according to the read command (Rd4) is output from the data signal line Data of the NOR IF through the data buffer DBuf.

The next read accesses (Pread5, Pread6, and Pread7) are page read accesses. Here, the object data of those page accesses are already held in the sense amplifier of the DRAM, so the data can be read directly from the sense amplifier. The page read period for (Pread5, Pread6, and Pread7) therefore is as short as 40 ns here, which is enough to read the object data. During this period, no refresh operation is carried out. In this page read operation, the DRAM control circuit Dcon issues read commands (Rd5, Rd6, and Rd7) to the DRAM sequentially.

The data read in response to the read commands (D5, D6, and D7) are output to the object fast and sequentially from the data signal line Data of the NOR IF through the data buffer DBuf.

As described above, also in the page read access of 280 ns is included a read cycle time of 200 ns and a refresh operation can be carried out in the memory module MEM1 in the remaining 80 ns. This means that the refresh operation for the DRAM is completely hidden and reading from the NOR IF is enabled.

Figure 8:
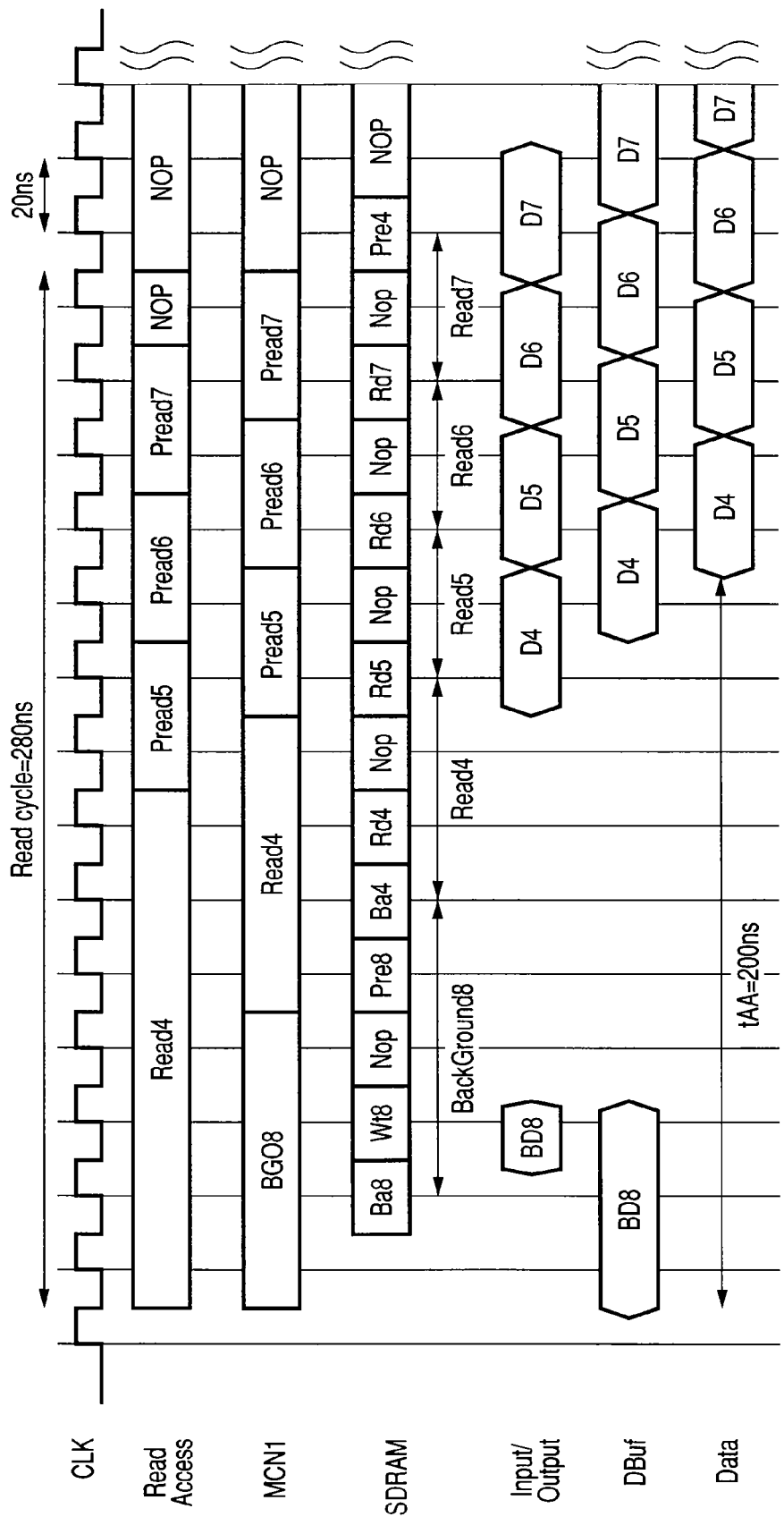
FIG. 8 is another timing chart of page read accesses to the memory system of the present invention.

FIG. 8 shows a timing chart of the operations of the memory system of the present invention to cope with consecutive page read accesses (Read4, Read5, Read6, and Read7) received from the NOR IF in a period of 280 ns during a background transfer operation.

In the read access (Read0) from the NOR IF, each address inputted to the access control circuit MCN1 from the address signal line AD is divided into a row address and a column address therein. Then, the access control circuit MCN1 determines whether the access is a random read access or page read access. If the row address changes, the access control circuit MCN1 regards the access as a random read access and if only the column address changes, the circuit MCN1 regards the access as a page read access.

If the read access (Read4) is a random read access, the access control circuit MCN1 sends a background data transfer request (BGO0) in the first period of 80 ns, then a read request (Read4) in the next period of 80 ns to the DRAM control circuit Dcon respectively.

After this, the DRAM control circuit Dcon issues an activation command (Ba8), a write command (Wt8), and a precharge command (Pre8) to the DRAM, then issues an activation command (Ba4) and a read command (Rd4) to the DRAM respectively. The data BD8 read from the non-volatile memory chip FLASH and stored in the data buffer DBuf is written in the DRAM according to the write command (Wt8).

Then, the memory system carries out a read operation according to the activation command (Ba4) and the read command (Rd4) in response to the random read access.

The data D4 read from the DRAM according to the read command (Rd4) is output to the object from the data signal line Data of the NOR type flash memory interface NOR IF through the data buffer DBuf.

The next read accesses (Pread5, Pread6, and Pread7) are page read accesses. Here, the object data of those page read accesses are already held in the sense amplifier of the DRAM, so the data can be read directly from the sense amplifier. The memory system can thus read the data in a period as short as 40 ns, which is enough to carry out the page read operations (Pread5, Pread6, and Pread7). During this period, no background data is transferred. In this page read operation, the DRAM control circuit Dcon issues the read commands (Rd5, Rd6, and Rd7) to the DRAM sequentially.

The data (D5, D6, and D7) read according to the read commands (Rd5, Rd6, and Rd7) are output to the object fast and sequentially from the data signal line Data of the NOR IF through the data buffer DBuf.

Also in the page read access of 280 ns is included a read cycle time of 200 ns and the remaining 80 ns is enough to carry out a write operation inside the memory module MEM1. This means that the operation of the background transfer to the DRAM is completely hidden and reading from the NOR IF is enabled.

As described above, a background operation area BGOArea is provided in the non-volatile memory chip FLASH and when transferring data to the DRAM from the FLASH, it is just required to read the data from the area BGOArea without writing from the NOR IF. The memory system can thus realize high security. Additionally, when reading data from the DRAM after the data transfer from the FLASH to the DRAM, the memory module MEM1 can hide the refresh operation for the DRAM, thereby realizing a NOR IF compatible, low cost, large capacity, and fast random access memory.

While a description has been made for a case in which an SDRAM type synchronous dynamic random access memory is used in this embodiment, the present invention can also apply to a case in which an asynchronous dynamic random access memory such as an EDO one is used to realize the NOR IF compatible, low cost, large capacity, and fast random access memory with the same operations.

If an asynchronous dynamic random access memory is used, no clock signal is required for the memory, so the clock operation power can be reduced more than the case in which a synchronous dynamic random access memory is used.

Second Embodiment

Figure 9:
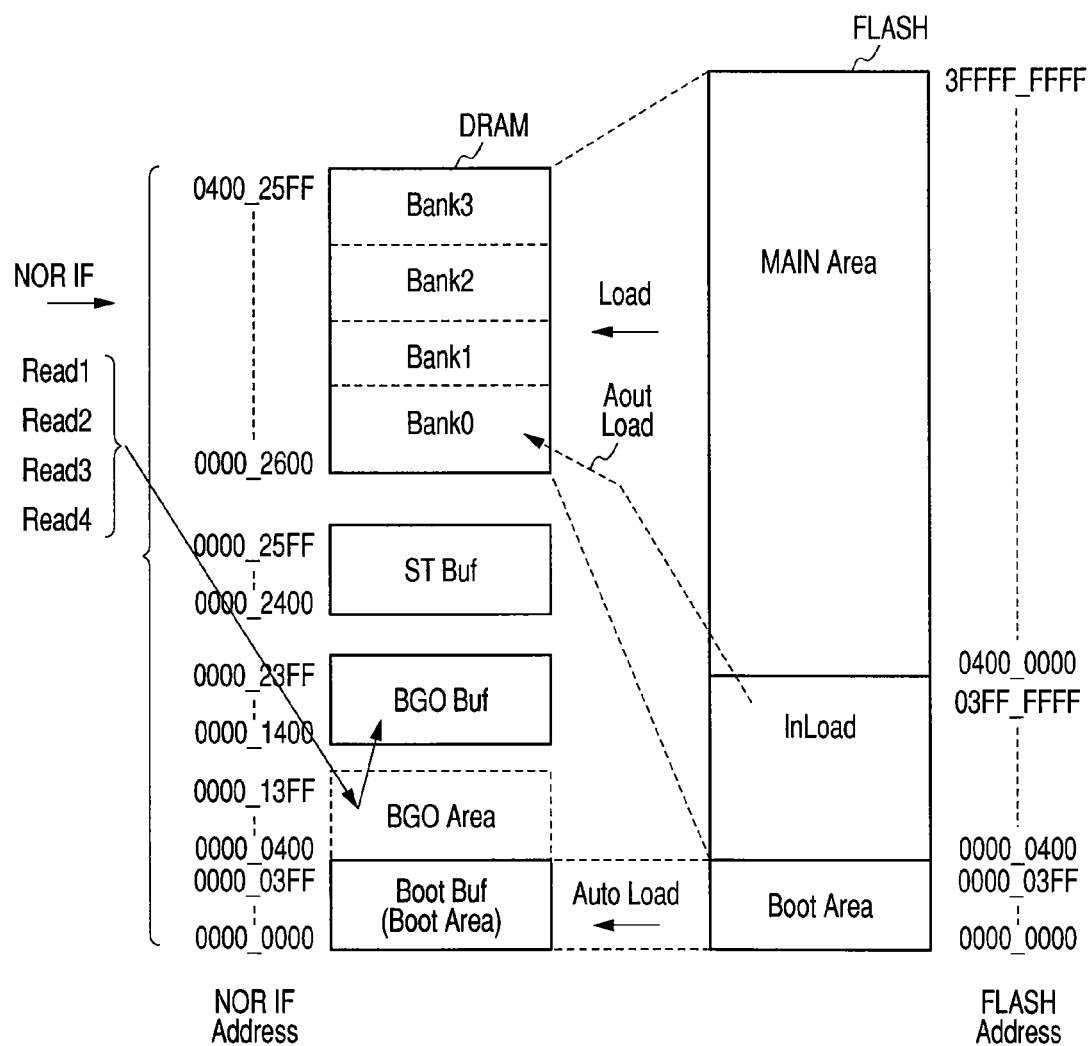
FIG. 9 is another example of the memory map of the memory system of the present invention.

FIG. 9 shows another example of the memory map managed by the memory management circuit MU. Although not limited specifically here, it is premised that the non-volatile memory chip FLASH is 1 G bytes, the dynamic random access memory DRAM is 64M bytes, the buffer BootBuf is 16 k bytes, the buffer BGOBuf is 4 k bytes, and the buffer STBuf is 512 k bytes in memory space respectively. Just like in the first embodiment, the non-volatile memory chip FLASH is smaller in capacity than the dynamic random access memory DRAM in this second embodiment. Consequently, the DRAM fabricating cost can be reduced.

And unlike the first embodiment, the FLASH is not provided with the background operation area BGOArea in this second embodiment. The area BGOArea is allocated in the main data area MAINArea.

In the example shown in FIG. 9, the memory chip FLASH is divided into a main data area MAINArea and a boot program area Boot Area. The area MAIN Area stores programs and data. The MAIN Area also includes an initial auto load area InLoad to be loaded automatically to the DRAM from the FLASH at the power-on time.

Although not limited specially here, the memory module MEM1 managed by the memory management circuit MU has an address space allocated within 0000_0000 to 0400_25FF in hexadecimal at the side closer to the NOR IF. And the address space is divided and allocated concretely as follows; buffer BootBuf (Boot Area): 0000_0000 to 0000_03FF, background operation area BGOArea: 0000_0400 to 0000_13FF, buffer BGOBuf: 0000_1400 to 0000_23FF, buffer STBuf: 0000_2400 to 0000_2600, and DRAM: 0000_2600 to 0400_25FF.

Although not limited specially here, the memory module MEM1 managed by the memory management circuit MU has an address space allocated within 0000_0000 to 3FFF_FFFF in hexadecimal at the side closer to the FLASH. And the address space is divided and allocated concretely as follows; main data area MAIN Area: 0000_0400 to 3FFF_FFFF and boot program area Boot Area: 0000_0000 to 0000_03FF. The address space of the initial auto load area InLoad in the main data area MAIN Area is allocated within 0000_0400 to 03FF_FFFF.

Figure 10:
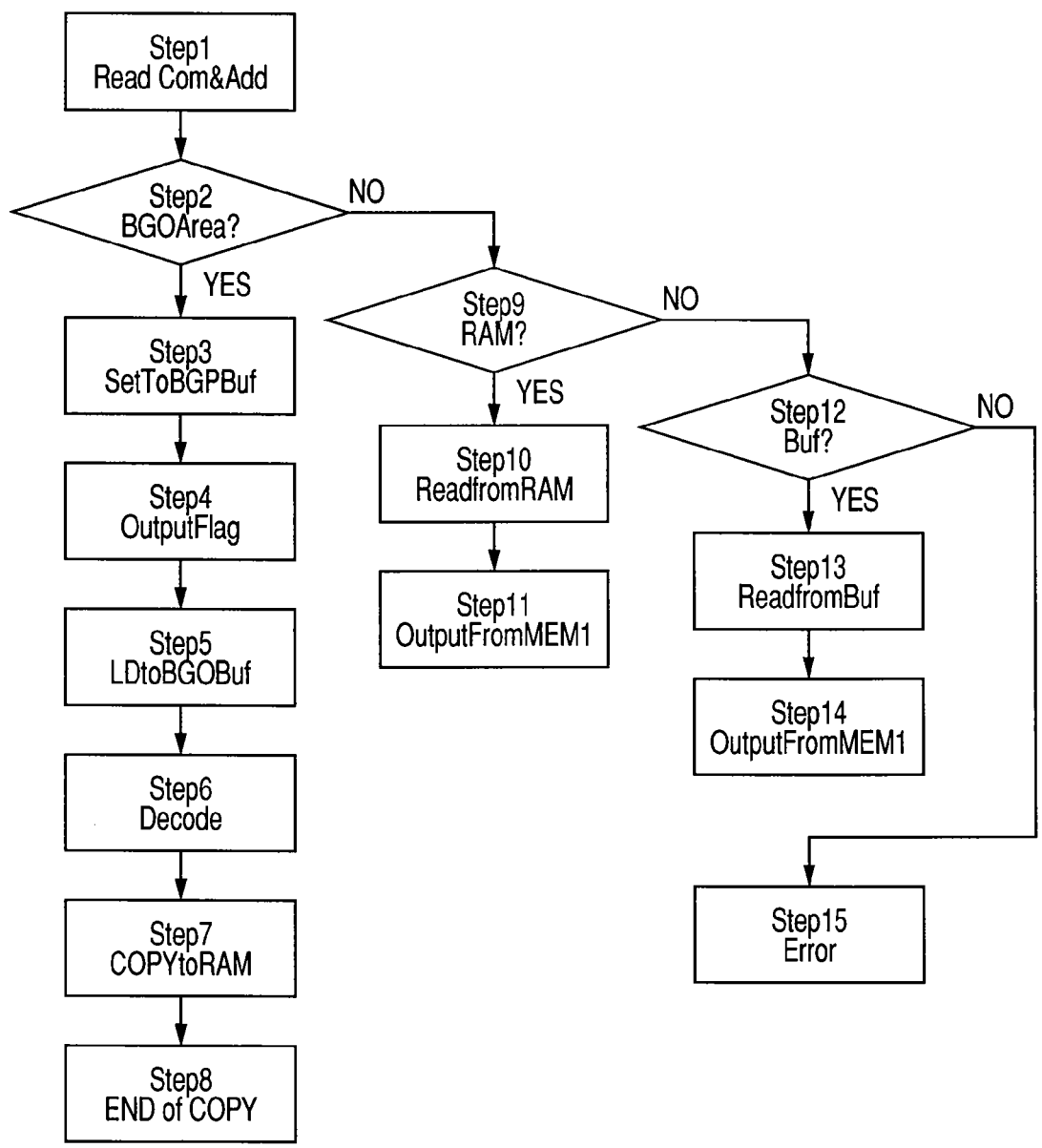
FIG. 10 is a flowchart of the data read operations carried out in the memory system of the present invention.

FIG. 10 shows a flowchart of another example of the read operation of the memory module MEM1 in the memory system of the present invention with respect to the memory map shown in FIG. 9.

Next, there will be described the operation of the memory module MEM1 with reference to FIGS. 9 and 10. The operation sequence of the memory module MEM1 at the powered-on time is the same as that in the first embodiment. Thus there will be described here an example of only the data transfer between the non-volatile memory chip FLASH and the dynamic random access memory DRAM.

The data transfer between the FLASH and the DRAM is started by the CPU, which reads data from the background operation area BGOArea provided in the FLASH through the NOR IF.

At first, the CPU sends random read commands to the access control circuit MU one by one through the NOR IF of the memory module MEM1 (step 1 in FIG. 10). At this time, the read addresses are 0000_0400, 0400_0000, 0000_2600, and 000F_FFFF in hexadecimal, although not limited specially here.

Then, the access control circuit MCN1 checks whether or not the received address value 0000_0400 is within the address space allocated to the background operation area BGOArea according to the address management information received from the memory management circuit MU (step 2 in FIG. 10).

The first input address value is within the address space allocated to the area BGOArea, so the address means a command of data transfer from the FLASH to the DRAM, that is, a background operation command.

The second read address 0400_0000 denotes a data transfer starting address in the FLASH, which is the source of the data transfer. The third read address 0000_2600 denotes a data transfer starting address in the DRAM, which is the destination of the data transfer. The fourth read address 000F_FFFF denotes a data transfer size that is 1M bytes. These second to fourth addresses are inputted together with the read commands, so their input values might become the same as those of the read accesses to the DRAM. However, in this case, the access control circuit MCN1 might already begin the background operation according to the first input address 0000_0400. The access control circuit MCN1 can therefore recognize the second to fourth addresses as part of the background operation command. Those read addresses are stored in the background operation buffer BGOBuf sequentially (step 3 in FIG. 10). And when those address values are stored completely in the buffer BGOBuf (step 4 in FIG. 10), the data of background operation acceptance completion is output to the CPU from the data signal line Data of the NOR IF. The CPU can thus know that the background operation command has been accepted. Additionally, just like in the first embodiment, dummy data can be output instead of the data of the background operation acceptance completion in this case. Also in this embodiment, a plurality of address inputs are required to input a background operation command. In this case, the dummy data can be output for each pair of a input combination of a read command and an address from the CPU.

After this, the access control circuit MCN1 reads object data from the background operation buffer BGOBuf (step 5 in FIG. 10) to decode the destination data transfer starting address and the data transfer size (step 6 in FIG. 10), thereby enabling the data transfer from the FLASH to the DRAM according to the decoding result. When any data is read from the FLASH, the read data is subjected to the error detection/correction in the circuit ECC as described above (step 7 in FIG. 10). Upon finishing this data transfer, the memory management circuit MU updates the address management information corresponding to the address of the data transferred from the FLASH to the DRAM. Finally, the circuit MU writes a transfer completion flag in the status buffer STBuf (step 8 in FIG. 10). The flag denotes completion of the data transfer.

Consequently, also in this case, the CPU can know the completion of the data transfer carried out just after the power-on by accessing the status buffer STBuf through the NOR IF and by reading the transfer completion flag.

As described above, in this second embodiment, because a background operation area BGOArea is provided outside the non-volatile memory chip FLASH and each read access to the area is detected, the background transfer operation is enabled. Furthermore, at this time, the source and destination addresses of the data transfer are inputted after the read access to the area BGOArea. Consequently, no writing from the NOR IF is required to transfer data from the FLASH to the DRAM. This is why the memory system can realize high security.

The read operations described with reference to FIG. 4 can also be carried out similarly for the DRAM, the status buffer STBuf, the background operation buffer BGOBuf, and the boot buffer BootBuf from the NOR IF respectively.

As described above, because data transfer from the FLASH to the DRAM is carried out only with read operations from the NOR IF outside the address space corresponding to the FLASH without requiring any writing, the area BGOArea can be eliminated from the FLASH. The main area MAIN Area can thus be expanded more in the FLASH while the memory system assures high security.

Furthermore, when reading data from the DRAM after necessary data is transferred beforehand from the FLASH to the DRAN, the memory module MEM1 can hide the DRAM refresh operation completely just like in the first embodiment. So, this embodiment can also realize a NOR IF compatible, low cost, large capacity, and fast random access memory.

Third Embodiment

Figure 11:
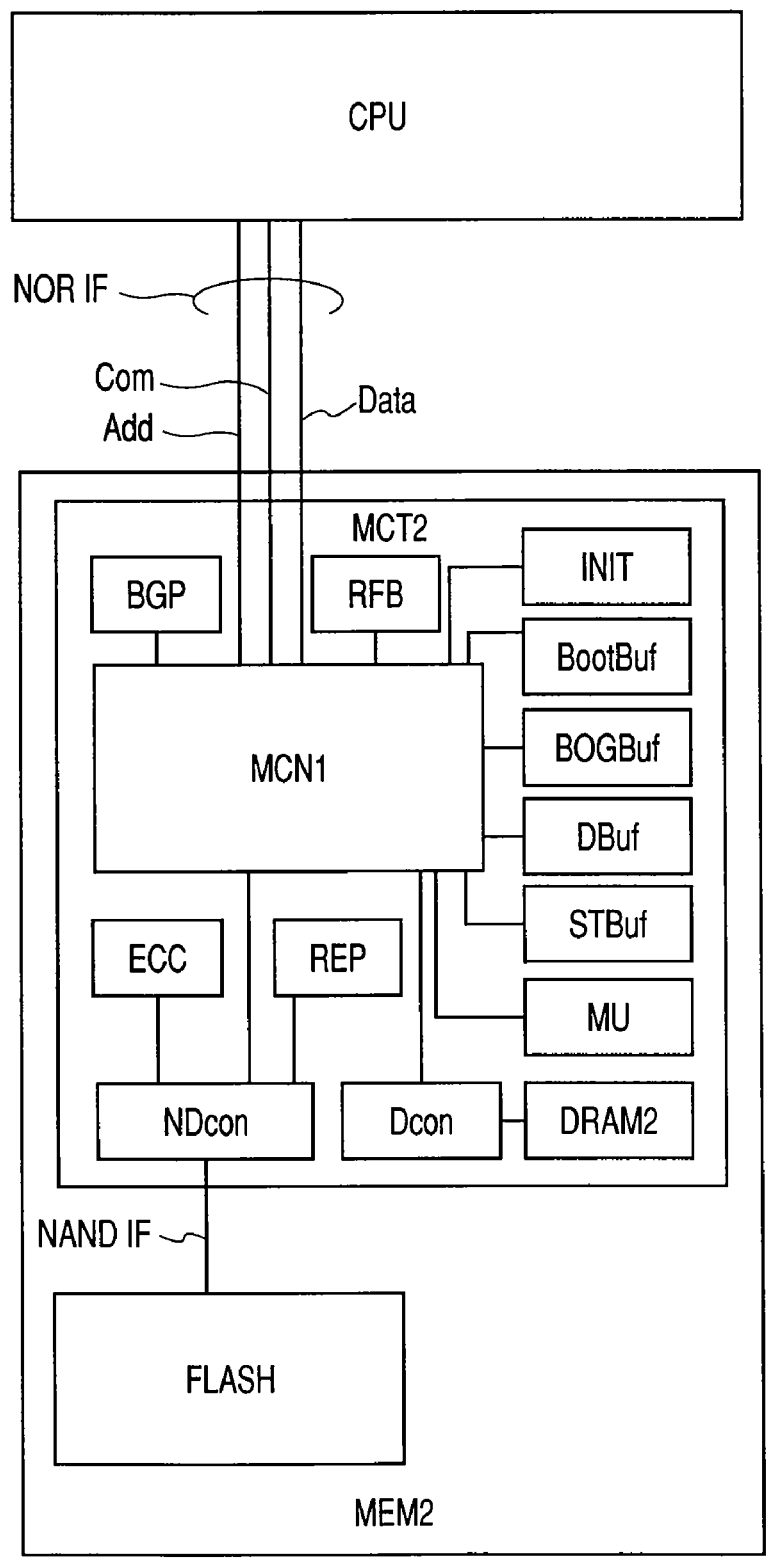
FIG. 11 is another block diagram of the memory system of the present invention.

FIG. 11 shows a block diagram of a memory module/memory system in a third embodiment of the present invention.

The memory module MEM2 incorporates a non-volatile memory chip FLASH and a control circuit MCT2. The control circuit MCT2 incorporates a dynamic random access memory DRAM2. The DRAM2 enables random accesses and page accesses.

The memory management circuit MU, the access control circuit MCN1, the background operation presetting circuit BGP, the refresh control circuit RFB, the initialization circuit INT, the buffer BootBuf, the buffer BGOBu, the buffer DBuf, the buffer STBuf, the flash memory control circuit NDcon, the DRAM control circuit Dcon, the error detection/correction circuit ECC, and the address replacement circuit REP provided in the control circuit MCT2 are all the same in operation as those in the first embodiment.

The control circuit MCT2 includes a NOR type flash memory interface NOR IF and a NAND type flash memory interface NAND IF.

The control circuit MCT2 reads data from the FLASH through the NAND IF and transfers the read data to the built-in DRAM2. The NOR IF enables data transfer between the memory module MEM1 and an outside thereof. Needless to say, the memory module MEM2 can also realize the same operations as those described in the second embodiment. And because the control circuit MCT2 incorporates the DRAM2, the wiring capacity between the DRAM control circuit Dcon and the DRAM2 can be reduced. As a result, the memory module MEM2 can lower the operation power.

Consequently, the memory module MEM2 that includes the control circuit MCT2 that incorporates the DRAM2 can operate at a low power while keeping its high security.

Fourth Embodiment

Figure 12:
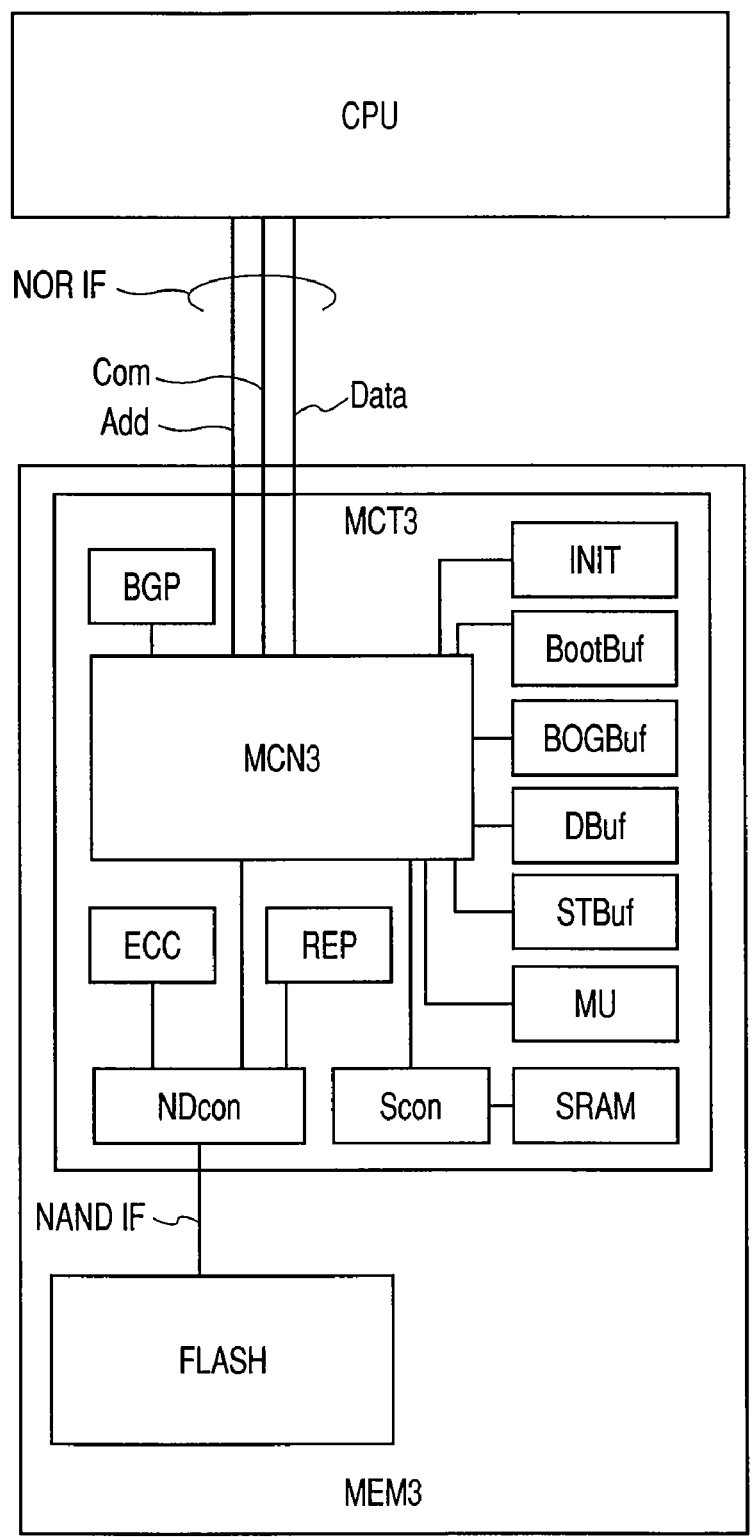
FIG. 12 is still another block diagram of the memory system of the present invention.

FIG. 12 shows a memory module/memory system in a fourth embodiment of the present invention. The memory module MEM3 includes a non-volatile memory chip FLASH and a control circuit MCT3. The control circuit MCT3 incorporates a static random access memory SRAM. The SPAM enables random accesses and page accesses.

The memory management circuit MU, the access control circuit Mcon1, the background operation presetting circuit BGP, the initialization circuit INT, the boot buffer BootBuf, the background operation buffer BGOBuf, the data buffer DBuf, the status buffer STBuf, the flash memory control circuit NDcon, the error detection/correction circuit ECC, and the address replacement circuit REP are all the same in operation as those in the first embodiment.

The SPAM control circuit Scon controls the SPAM. The control circuit MCT3 includes a NOR IF and a NAND type flash memory interface NAND IF.

The control circuit MCT3 reads data from the FLASH through the NAND IF and the flash memory control circuit NDcon respectively, then transfers the read data to the data buffer DBuf. The control circuit MCT3 also reads data from the data buffer DBuf and transfers the read data to the SRAM through the SPAM control circuit Scon.

The NOR IF enables data transfer between the memory module MEM3 and an outside thereof.

Figure 13:
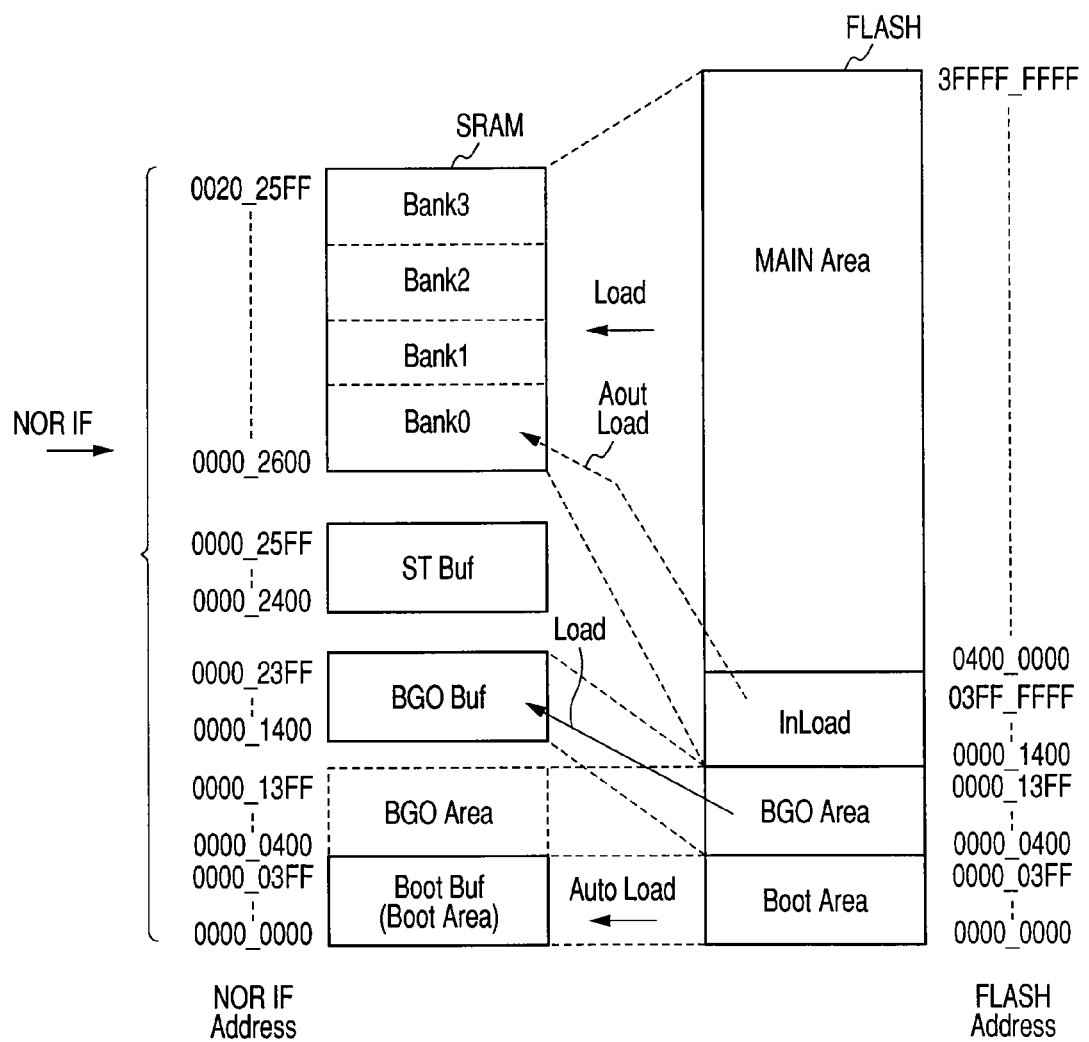
FIG. 13 is still another example of the memory map of the memory system of the present invention.

FIG. 13 shows an example of a memory map employed for the memory module MEM3 and managed by the memory management circuit MU. Although not limited specially here, it is premised that the FLASH is 1 G bytes, the SRAM is 2M bytes, the boot buffer BootBuf is 16 k bytes, the buffer BGOBuf is 4 k bytes, and the buffer STBuf is 512 bytes in memory space respectively. In this embodiment, the FLASH is smaller in memory capacity than the SRAM. Consequently, the random access memory can be reduced in manufacturing cost.

In the example shown in FIG. 13, the FLASH is divided into a main data area MAIN Area, a boot program area Boot Area, and a background operation area BGOArea. The main area MAIN Area stores programs and data. The main data MAIN Area also includes an initial auto load area InLoad to be loaded automatically from the FLASH to the SRAM at the power-on time.

Although not limited specially here, the memory module MEM3 managed by the memory management circuit MU has an address space allocated within 0000_0000 to 0020_25FF in hexadecimal at the side closer to the NOR IF. The address space of the MEM3 is further divided and allocated as follows; buffer BootBuf (Boot Area): 0000_0000 to 0000_03FF, background operation area BGOArea: 0000_0400 to 0000_13FF, buffer BGOBuf: 0000_1400 to 0000_23FF, buffer STBuf: 0000_2400 to 0000_25FF, and SRAM: 0000_2600 to 0020_25FF.

Although not limited specially here, the memory module MEM1 managed by the memory management circuit MU has an address space allocated within 0000_0000 to 3FFF_FFFF in hexadecimal at the side closer to the FLASH. The address space of the MEM1 is further divided and allocated as follows; main data area MAIN Area: 0000_1400 to 3FFF_FFFF, boot program area Boot Area: 0000_0000 to 0000_03FF, and background operation area BGOArea: 0000_0400 to 0000_13FF. The initial auto load area InLoad provided in the main data area MAIN Area is allocated to the address space within 0000_1400 to 03FF_FFFF.

Figure 14:
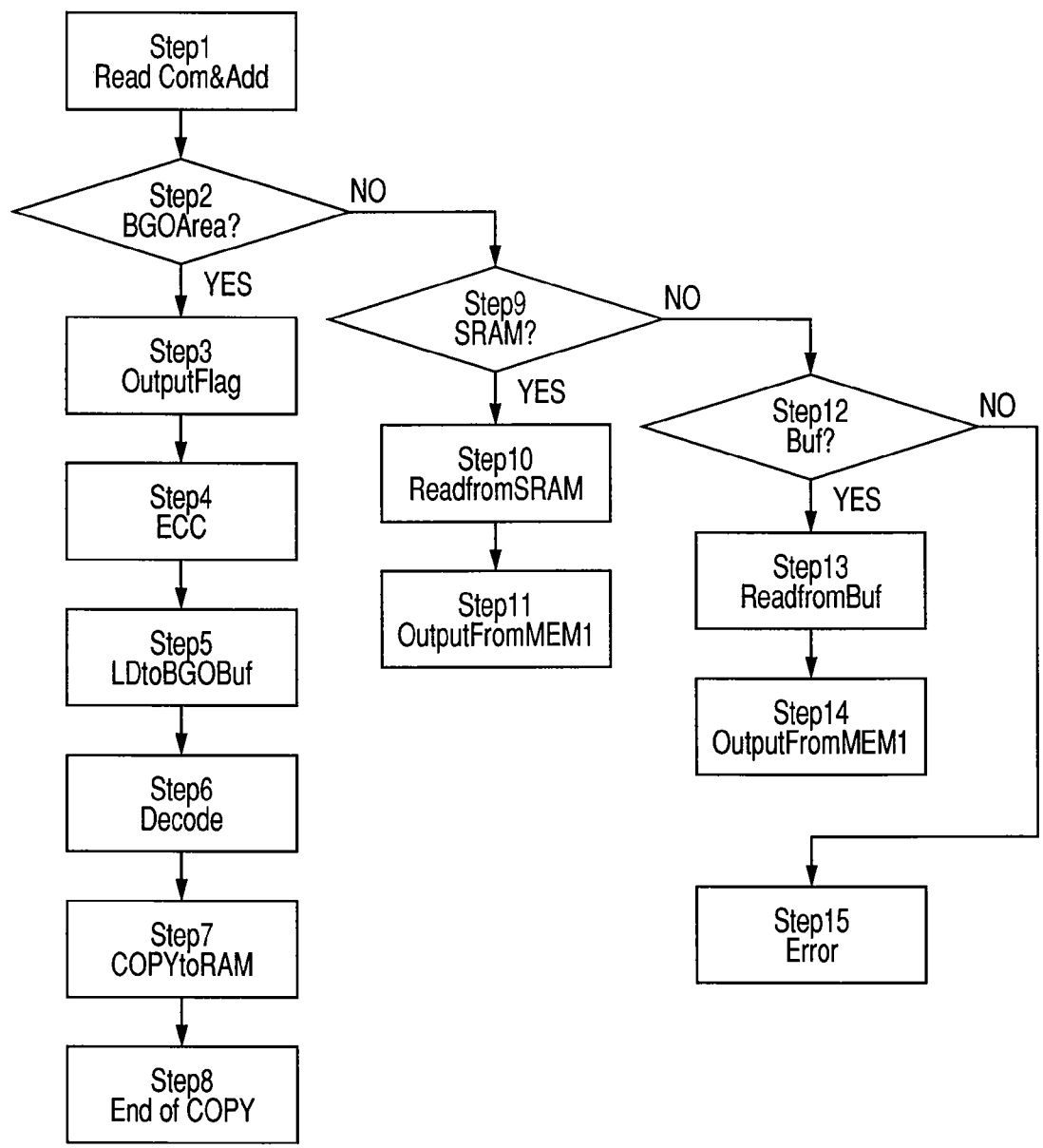
FIG. 14 is another flowchart of the data read operations carried out in the memory system of the present invention.

Next, there will be described the operation of the memory module MEM3. FIG. 14 shows a flowchart of the read operation of the MEM3 as an example.

The operation sequence of the MEM3 to be carried out at the power-on time is almost the same as that in the first embodiment. However, the static random access memory SRAM does not require any refresh operation, so the refresh operation carried out in the period T3-2 in FIG. 3 is omitted.

Next, there will be described an example of data transfer between the non-volatile memory chip FLASH and the SRAM with reference to FIGS. 13 and 14. The data transfer is carried out after the power-on time operation sequence is finished. Unlike the case shown in FIG. 10, the SRAM is used instead of the DRAM here. Other items are the same as those in FIG. 10, so the description for those items will be omitted here.

Figure 15:
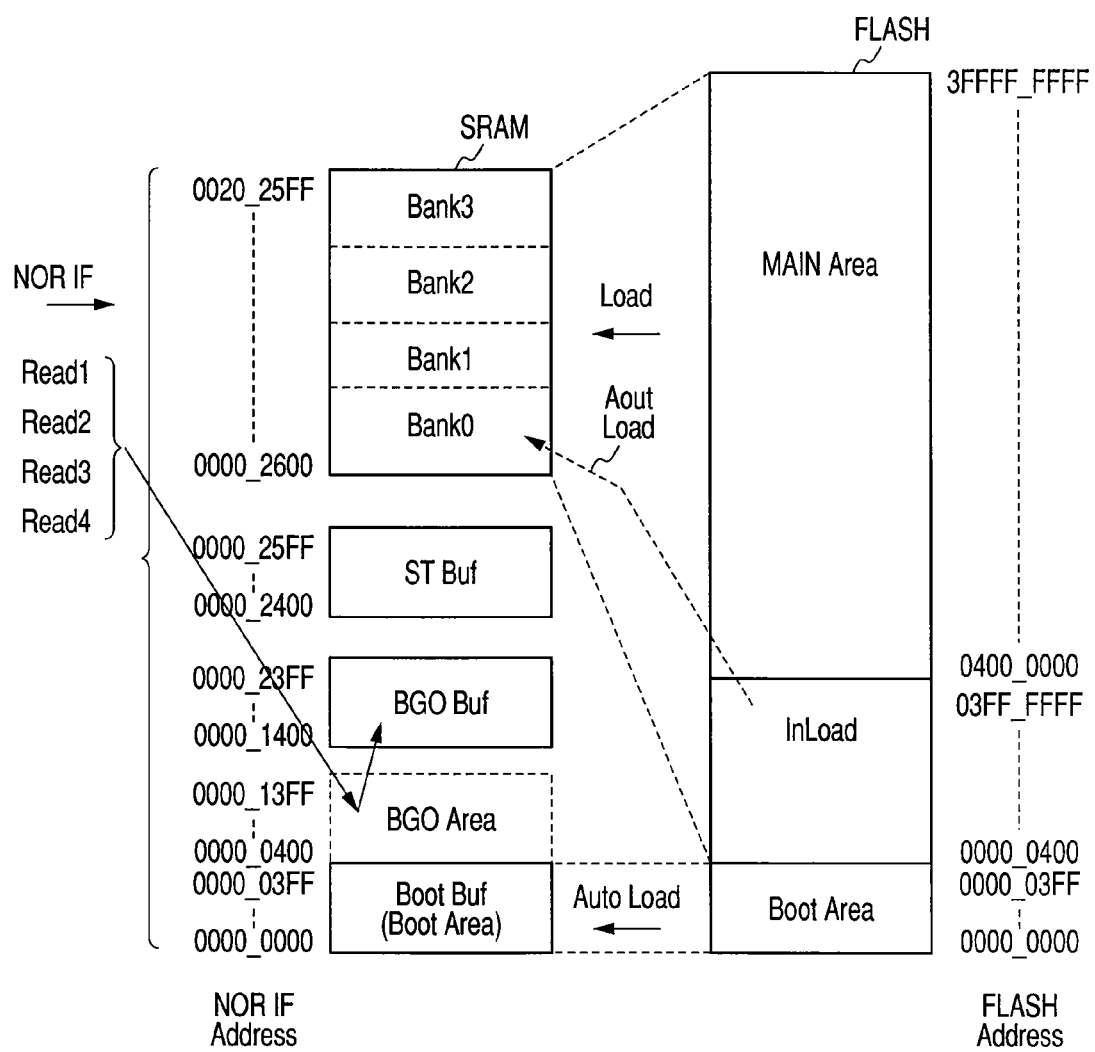
FIG. 15 is still another example of the memory map of the memory system of the present invention.

FIG. 15 shows another example of the memory map managed by the memory management circuit MU of the memory module MEM3. Although not limited specially here, it is premised that the FLASH is 1 G bytes, the SRAM is 2M bytes, and the buffers BootBuf, BGOBuf, and STBuf are 16 k bytes, 4 k bytes, and 512 bytes in memory space respectively. Just like in the first embodiment, the FLASH is also smaller than the SRAM in memory capacity in this embodiment. Consequently, the fabricating cost of the random access memory can be reduced.

In the example shown in FIG. 15, the FLASH is divided into a main data area MAIN Area and a boot program area Boot Area. The main data area MAIN Area stores programs and data. The main data area MAIN Area also includes an initial auto load area InLoad to be loaded automatically from the FLASH to the SRAM at the power-on time.

Although not limited specially here, it is premised that the memory module MEM1 managed by the memory management circuit MU has an address space allocated within 0000_0000 to 0020_25FF in hexadecimal at the side closer to the NOR IF. The address space of the MEM1 is further divided and allocated as follows; buffer BootBuf (Boot Area): 0000_0000 to 0000_03FF, background operation area BGO Area: 0000_1400 to 0000_23FF, buffer STBuf: 0000_2400 to 0000_25FF, and static random access memory SRAM: 0000_2600 to 0020_25FF.

Although not limited specially here, it is premised that the memory module MEM3 managed by the memory management circuit MU has a memory space allocated within 0000_0000 to 3FFF_FFFF in hexadecimal at the side closer to the FLASH. The memory space of the MEM3 is further divided and allocated as follows; main data area MAIN Area: 0000_0400 to 3FFF_FFFF and boot program area Boot Area: 0000_0000 to 0000_03FF. In the address space of the main data area MAIN Area, the initial auto load area InLoad is allocated within 0000_0400 to 03FF_FFFF.

Figure 16:
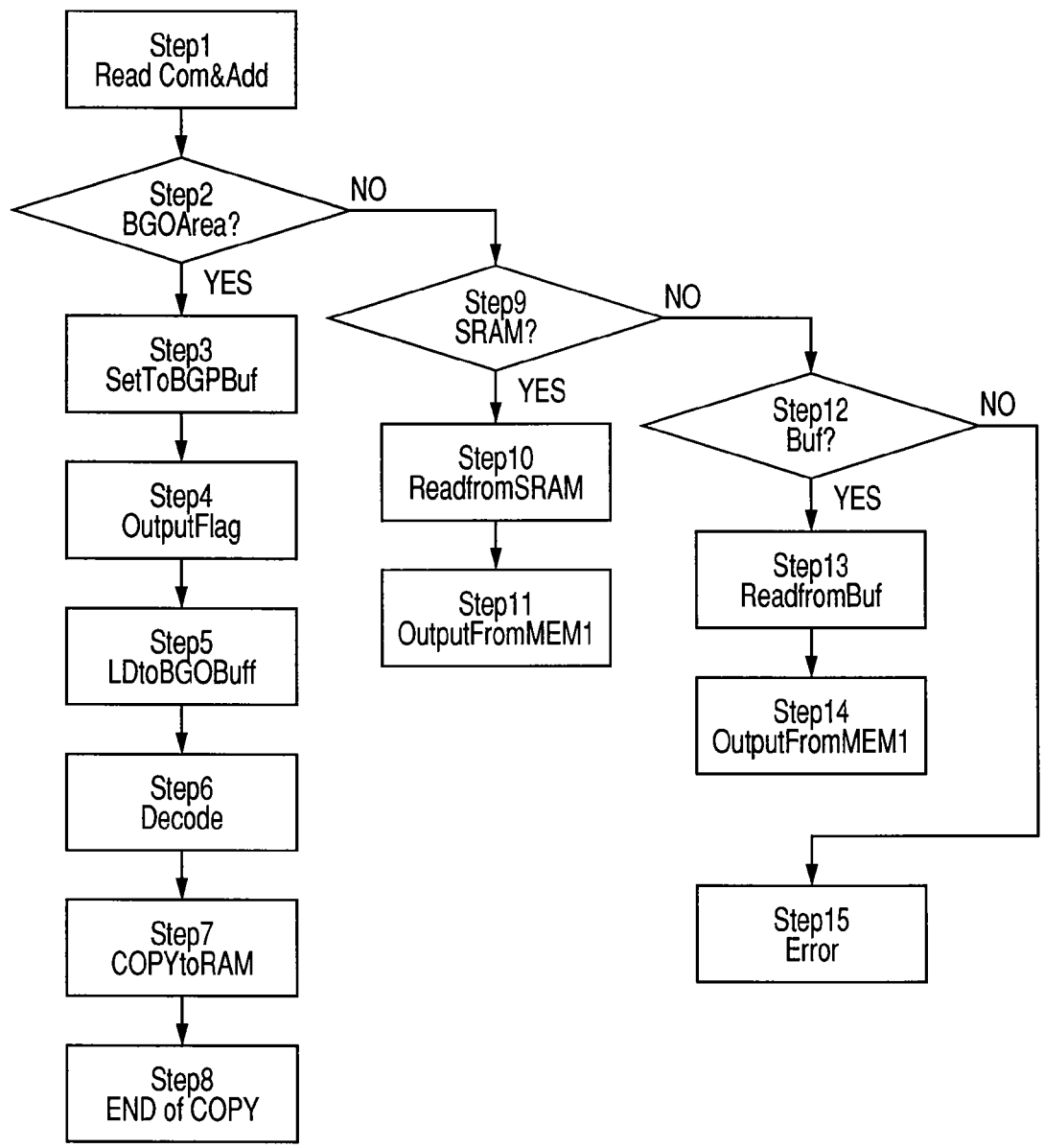
FIG. 16 is still another flowchart of the data read operations carried out in the memory system of the present invention.

FIG. 16 shows a flowchart of the read operation of the memory module MEM3 with respect to the memory map shown in FIG. 15 as another example. The read operation itself is the same as that shown in FIG. 10, so the description for the operation will be omitted here. Also in this case, the same effect can be assured even when the DRAM is replaced with an SRAM. Furthermore, although the SRAM is smaller in capacity than the DRAM, the SRAM can omit the refresh operation and requires no refresh hiding that is required for the DRAM.

Figure 17:
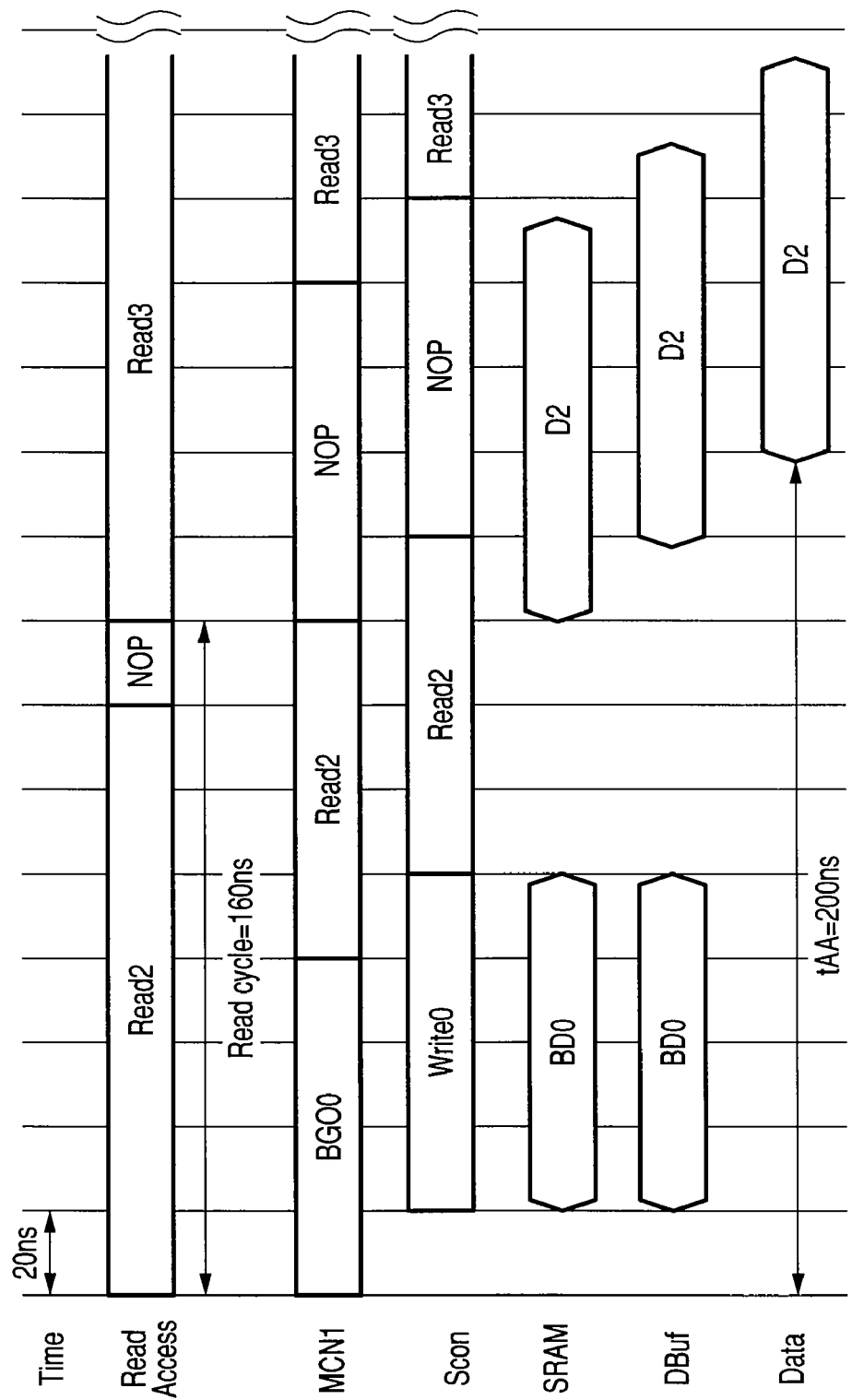
FIG. 17 is a timing chart of random read accesses to the memory system of the present invention.
Figure 18:
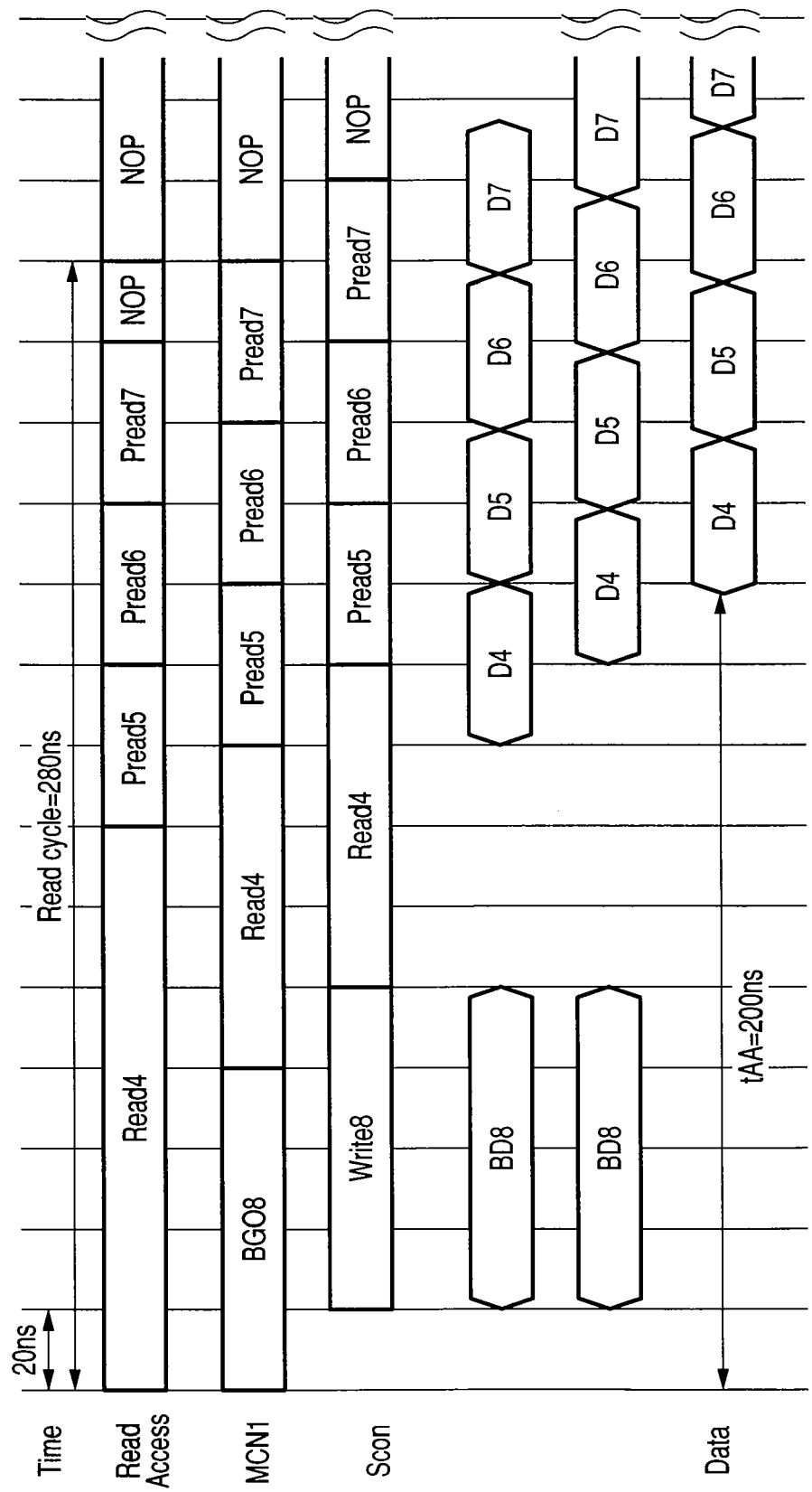
FIG. 18 is a timing chart of page read accesses to the memory system of the present invention.

FIGS. 17 and 18 show how to read data. The read operation is the same as that shown in FIGS. 6 through 8, so the description for the operation will be omitted here.

As described in the fourth embodiment, the DRAM can be replaced with an SRAM in the first to third embodiments. In this case, although the random access memory is reduced in capacity to achieve the cost reduction, the memory requires no refresh operation, thereby it is easy to control the memory. This is an advantage of using the SRAM.

Fifth Embodiment

Figure 19:
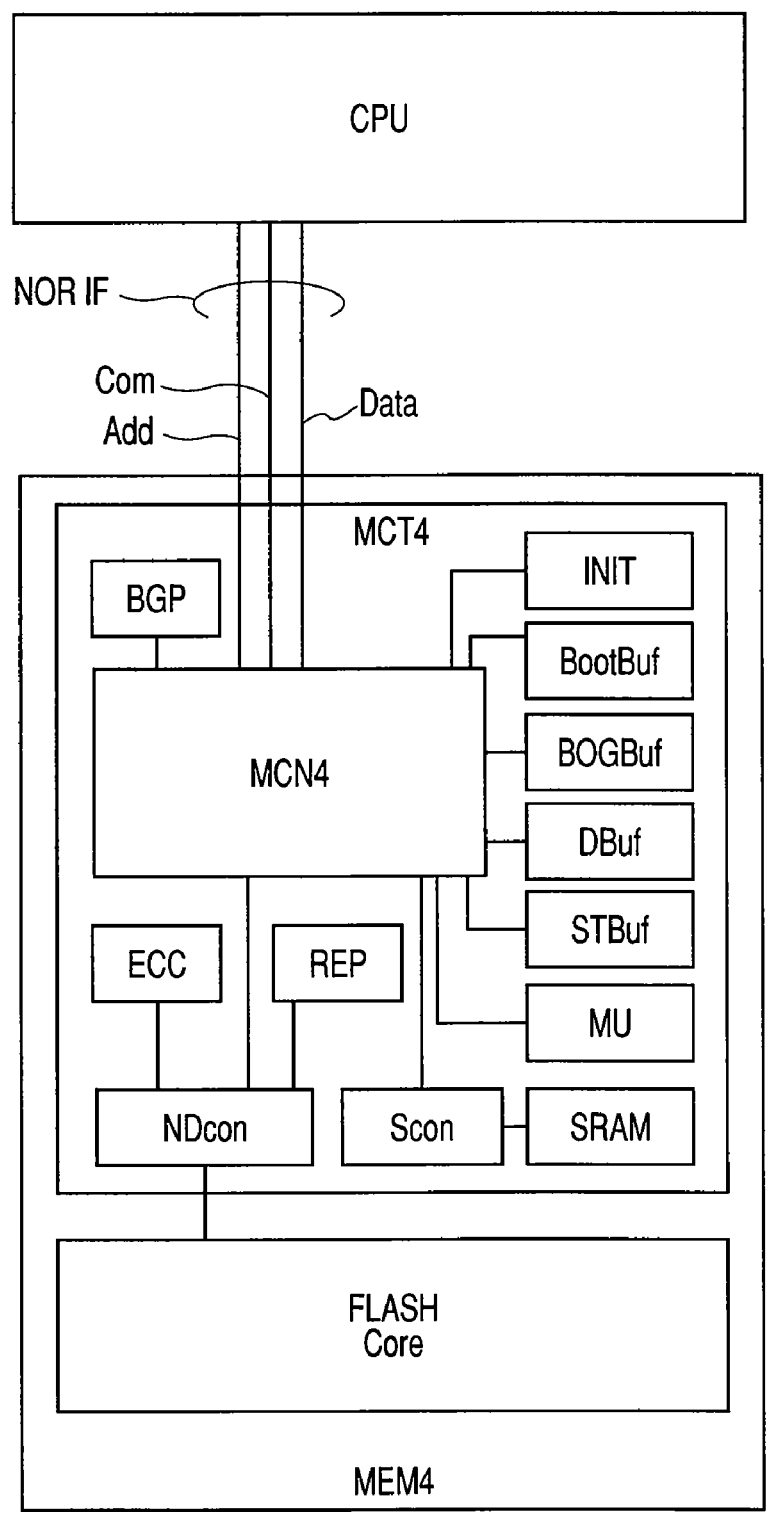
FIG. 19 is still another block diagram of the memory system of the present invention.

FIG. 19 shows a memory module/memory system in a fifth embodiment.

The memory module MEM4 includes a non-volatile memory core FLASHCore and a control circuit MCT4 that are formed on the same semiconductor. The control circuit MCT4 includes a static random access memory SRAM and the SRAM enables random accesses and page accesses.

The memory management circuit MU, the access control circuit Mcon1, the background operation presetting circuit BGP, the initialization circuit INT, and the buffers BootBuf, BGOBuf, DBuf, and STBuf, as well as the flash memory control circuit NDcon, the error detection/correction circuit ECC, and the address replacement circuit REP provided in the control circuit MCT4 are all the same in operation as those in the first embodiment. The SRAM control circuit Scon controls the SRAM and the control circuit MCT4 is the same in operation as that in the fourth embodiment.

The control circuit MCT4 reads object data from the FLASHCore through the flash memory control circuit NDcon and transfers the read data to the data buffer DBuf. The control circuit MCT4 also reads the object data form the data buffer DBuf and transfers the read data to the SRAM through the SRAM control circuit Scon. The NOR with reference to FIGS. 13 and 14 IF enables data transfer between the memory module MEM3 and an outside of the MEM4. Also in this embodiment, a memory map is provided similarly to that shown in FIGS. 13 and 15 and the read operations are similar to those shown in FIGS. 14 and 16. And because the non-volatile memory, the SRAM, and the control circuit are formed on the same semiconductor, the data wiring capacity between the non-volatile memory and the control circuit can be reduced. Therefore, the memory module MEM4 can further be lowered in operation power.

Sixth Embodiment

Figure 20A:
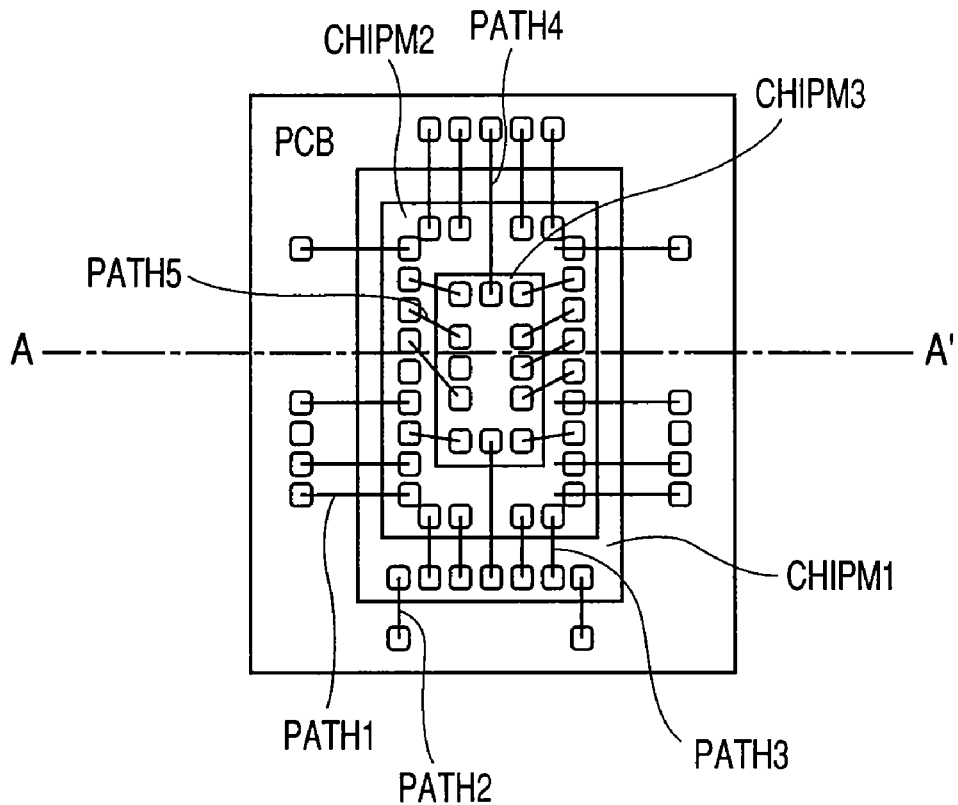
FIG. 20A is a top view of a multi-chip module that includes a memory module.
Figure 20B:
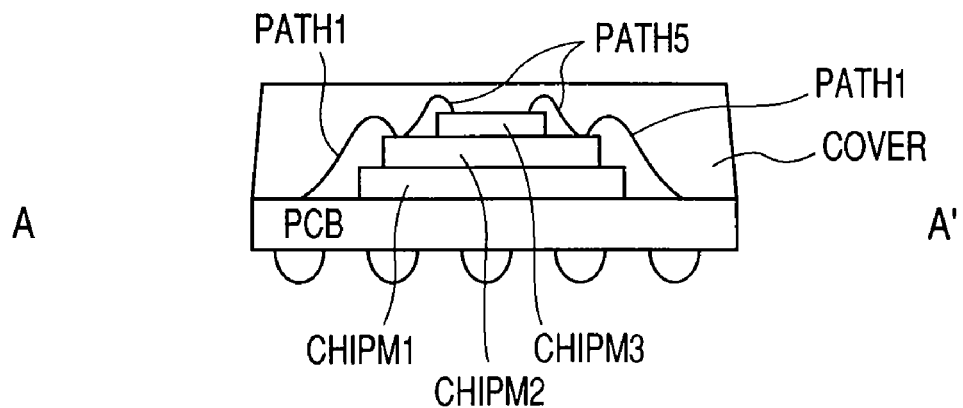
FIG. 20B is a cross sectional view taken on line A-A' of FIG. 20A.

FIG. 20 shows a sixth embodiment of the present invention. FIG. 20A shows a top view and FIG. 20B shows a cross sectional view taken on line A-A' of FIG. 20A.

The multi-chip module in this embodiment includes CHIP1, CHIP2, and CHIP3 mounted on a substrate PCB (e.g., printed circuit board made of a glass epoxy substrate). The substrate is mounted in the device with a ball-grid array (BGA). Although not limited specially here, if the CHIP1 is a first non-volatile memory, the CHIP2 is a first random access memory, and the CHIP3 is a first control circuit, this multi-chip module enables the memory module MEM1 to be sealed in one package.

Although not limited specially here, if it is premised that the CHIP1 is a first non-volatile memory, the CHIP2 is a first volatile memory, and the CHIP3 is a first CPU, this multi-chip module enables the memory systems shown in FIGS. 11 and 12 to be sealed in one package.

The CHIPM1 is connected to a bonding pad on the substrate PCB through a bonding wire (PATH2) and the CHIPM2 is connected to another bonding pad on the substrate PCB through another bonding wire (PATH1). The CHIPM3 is connected to still another bonding pad on the substrate PCB through still another bonding wire (PATH4). The CHIPM1 and the CHIPM2 are connected to each other through still another bonding wire (PATH3) and the CHIPM2 and the CHIPM3 are connected to each other through still another bonding wire (PATH5).

The chips-mounted surface of the substrate PCB is resin-molded to protect those chips and connection wirings. Furthermore, the resin molded surface of the substrate PCB can also be covered with metal, ceramic, or resin (COVER).

In this embodiment, bear chips are mounted on the PCB directly, so the memory module area is reduced. In addition, chips are stacked on the PCB, the wiring between each chip and the substrate PCB can be shortened; thereby, the mounting area can be reduced. Furthermore, because bonding wires are used to connect each chip to another, as well as each chip to the substrate, the number of memory module fabricating processes can be reduced.

Furthermore, each chip is connected directly to another through a bonding wire, the number of bonding pads and the number of bonding wires on the substrate are reduced; thereby, the number of processes for fabricating the memory module is reduced. If a resin cover is used, the multi-chip module will be more strengthened in rigidity and have more excellent heat radiation and shielding effects.

Seventh Embodiment

Figure 21A:
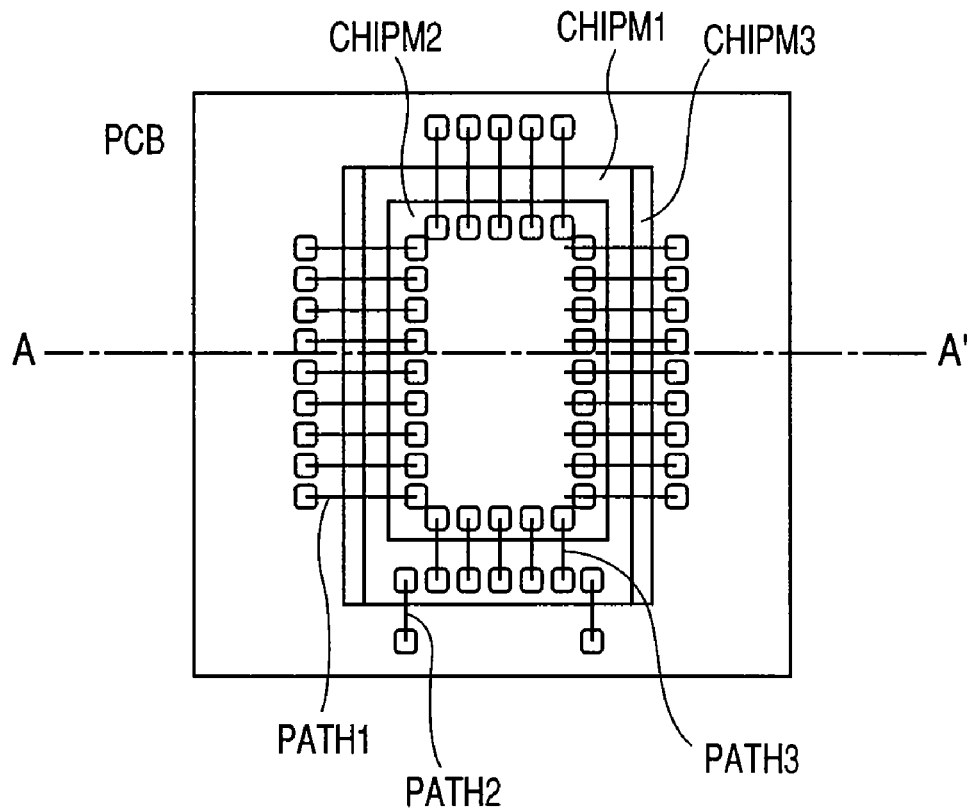
FIG. 21A is a top view of the memory module mounted multi-chip module configured differently from that shown in FIG. 20.
Figure 21B:
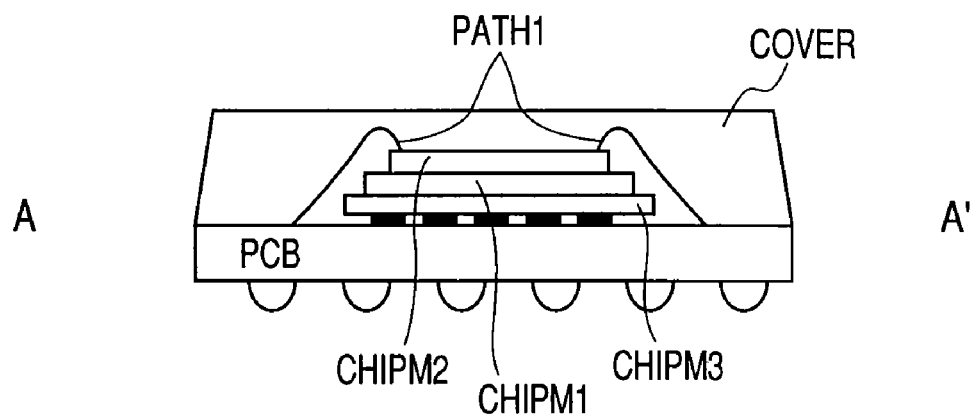
FIG. 21B is a cross sectional view taken on line A-A' of FIG. 21A.

FIG. 21 shows a seventh embodiment of the present invention. FIG. 21A shows a top view of a multi-chip module and FIG. 21B shows a cross sectional view taken on line A-A' of FIG. 21A.

The multi-chip module in this seventh embodiment includes CHIPM1, CHIPM2, and CHIPM3 mounted on the same substrate PCB (PCB made of a glass epoxy substrate). The substrate PCB is mounted in the module with a ball grid array (BGA). The CHIPM1 is a first non-volatile memory and the CHIPM2 is a control circuit that incorporates the first random access memory. If the CHIPM3 is a control circuit, this multi-chip module enables the memory module shown in FIG. 1 to be sealed in one package.

Additionally, the CHIPM1 is a first non-volatile memory and the CHIPM2 is a control circuit that incorporates the first non-volatile memory. If the CHIPM3 is a CPU, this multi-chip module enables the memory modules shown in FIGS. 11 and 12 to be sealed in one package.

The CHIPM1 is connected to a bonding pad through a bonding wire (PATH2) on the substrate PCB and the CHIPM2 is connected to another bonding pad through another bonding wire (PATH1) on the substrate PCB. The CHIPM1 and the CHIPM2 are connected to each other through still another bonding wire (PATH3). And a ball grid array is used to mount and wire the CHIPM3.

Because three chips can be stacked with this mounting method, the mounting area can be reduced. Furthermore, the bonding between the CHIPM3 and the substrate is not required; thereby, the number of bonding wires and the number of fabricating processes can be reduced respectively. Thus the multi-chip module is more improved in reliability.

Eighth Embodiment

Figure 22A:
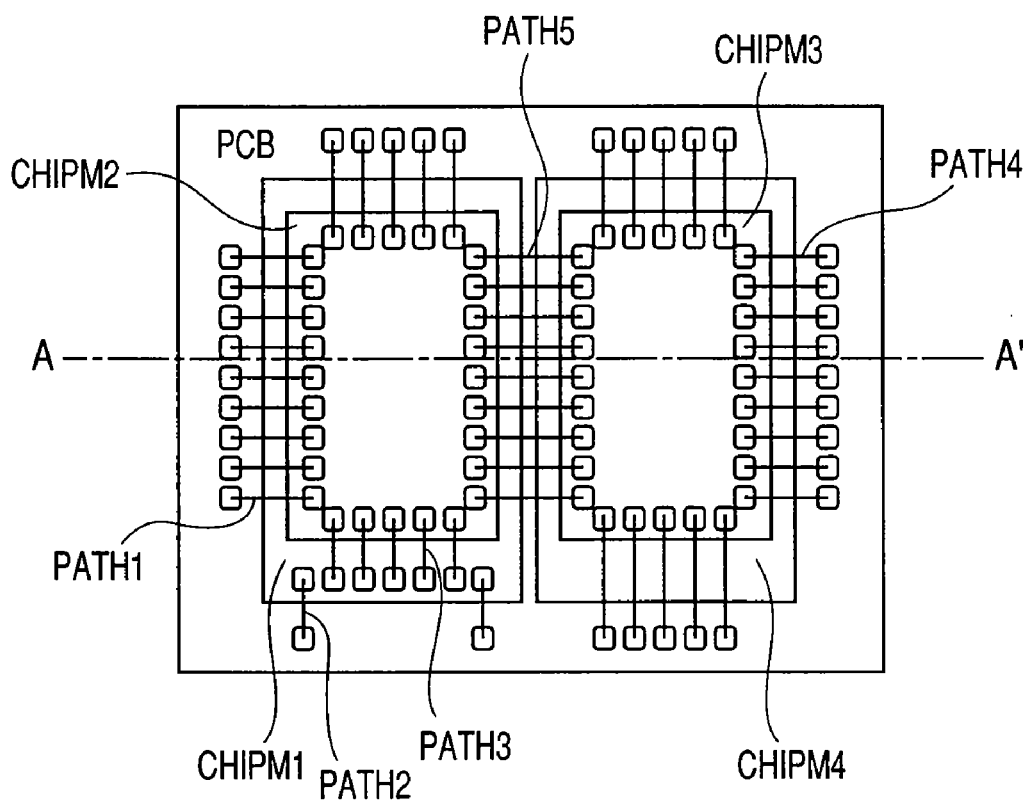
FIG. 22A is another top view of the memory module mounted multi-chip module configured further differently from that shown in FIG. 21.
Figure 22B:
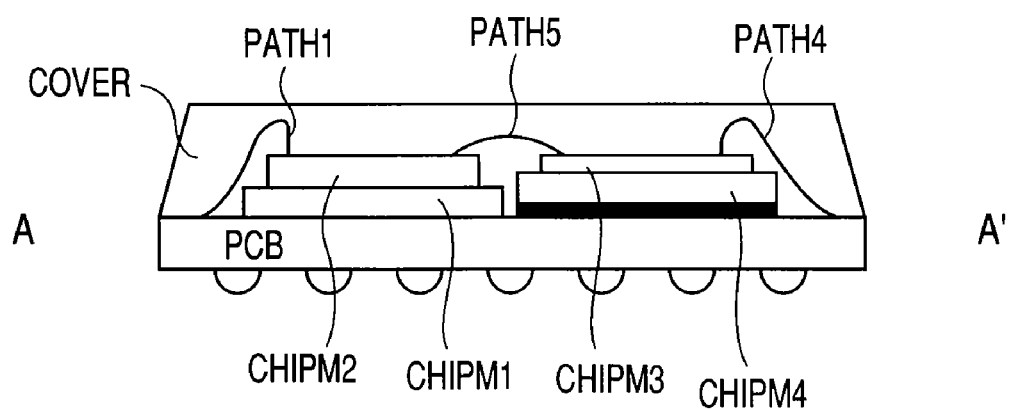
FIG. 22B is a cross sectional view taken on line A-A' of FIG. 22A.

FIG. 22 shows an eighth embodiment of the multi-chip module of the present invention. FIG. 22A shows a top view of the multi-chip module and FIG. 22B shows a cross sectional view taken on line A-A' of FIG. 22A.

The memory module in this embodiment includes CHIPM1, CHIPM2, and CHIPM3 mounted on the same substrate PCB (e.g., PCB made of a glass epoxy substrate). The substrate PCB is mounted on the device with a ball grid array (BGA). If the CHIPM1 is a non-volatile memory, the CHIPM2 is a random access memory, the CHIPM3 is a control circuit, and the CHIPM4 is a CPU, this mounting method enables the memory system shown in FIG. 1 to be sealed in one package.

The CHIPM1 is connected to a bonding pad through a bonding wire (PATH2) on the substrate PCB and the CHIPM2 is connected to another bonding pad through another bonding wire (PATH4) on the substrate PCB. And the CHIPM3 is connected to still another bonding pad through still another bonding wire (PATH1) on the substrate.

The CHIPM1 and the CHIPM3 are connected to each other through a bonding wire (PATH3) and the CHIPM2 and the CHIPM3 are connected to each other through another bonding wire (PATH5). The CHIPM4 is mounted and wired with a ball grid array (BGA). Because this mounting method enables bear chips to be mounted on the same printed circuit board PCB, the multi-chip module can be reduced in mounting area. Furthermore, because those chips are disposed closely to each another, the wiring between chips can be shortened.

Because each chip is connected directly to another through a bonding wire, the number of bonding pads and the number of bonding wires on the substrate can be reduced, thereby the number of processes for fabricating the memory module can be reduced. Furthermore, the bonding between the CHIPM4 and the substrate is omitted, so the number of bonding wires can be reduced. Thus the number of fabricating processes can be reduced; thereby the multi-chip module is more improved in reliability.

Ninth Embodiment

Figure 23A:
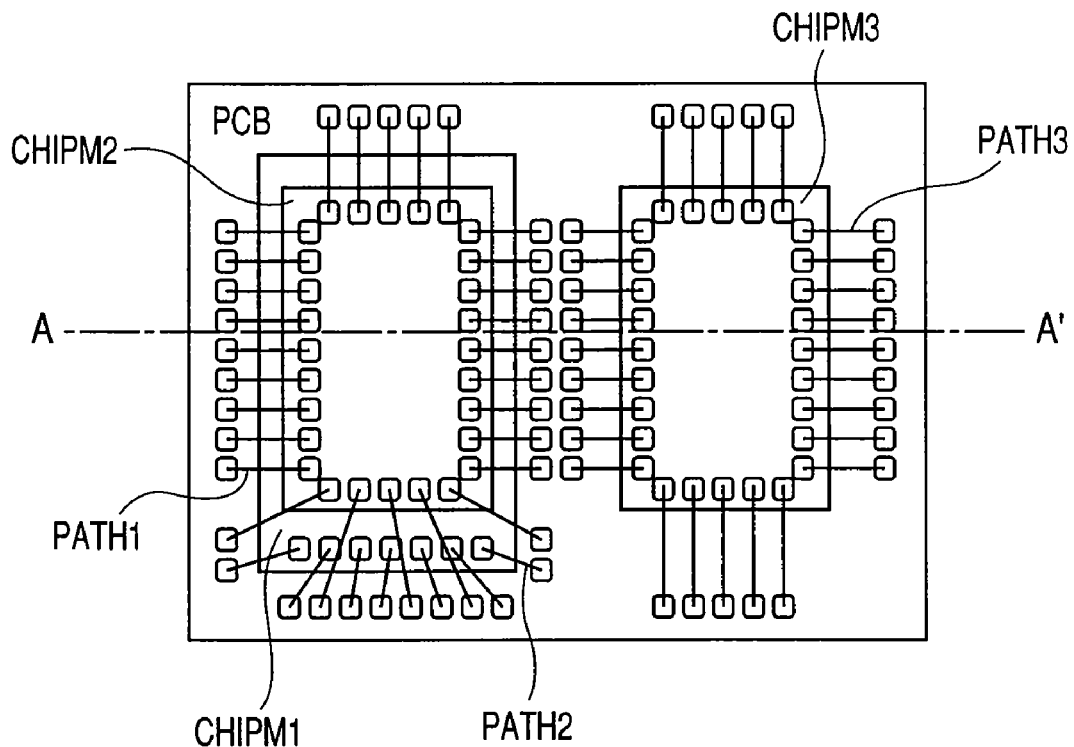
FIG. 23A is still another top view of the memory module mounted multi-chip module configured further differently from that shown in FIG. 22.
Figure 23B:
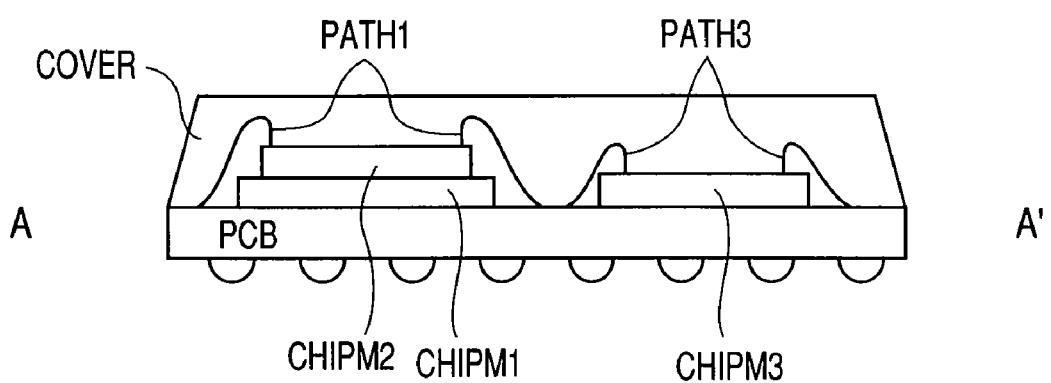
FIG. 23B is a cross sectional view taken on line A-A' of FIG. 23A.

FIG. 23 shows a ninth embodiment of the memory system of the present invention. FIG. 23A shows a top view of the memory system and FIG. 23B shows a cross sectional view taken on line A-A' of FIG. 23A.

The memory module in this embodiment includes CHIPM1, CHIPM2, and CHIPM3 mounted on a substrate PCB (e.g., PCB made of a glass epoxy substrate). The substrate is mounted on the device with a ball grid array (BGA). If the CHIPM1 is a non-volatile memory, the CHIPM2 is a random access memory, and the CHIPM3 is a control circuit, this mounting method enables the memory module MEM1 shown in FIG. 11 to be sealed in one package. And if the CHIPM1 is a non-volatile memory, the CHIPM2 is a volatile memory, and the CHIPM3 is a CPU, this mounting method enables the memory systems shown in FIGS. 11 and 12 to be sealed in one package.

The CHIPM1 is connected to a bonding pad through a bonding wire (PATH2) on the substrate PCB and the CHIPM2 is connected to another bonding pad through another bonding wire (PATH1) on the substrate PCB. And the CHIPM3 is connected to still another bonding pad through still another bonding wire (PATH3) on the substrate. Because bear chips are mounted directly on a printed circuit board PCB in this embodiment, the multi-chip module can be reduced in mounting area. Furthermore, because those chips are disposed closely to each another, the wiring between chips can be shortened. And each chip is connected to the substrate through a bonding wire in a unified manner, the number of processes for fabricating the multi-chip module can be reduced.

Tenth Embodiment

Figure 24A:
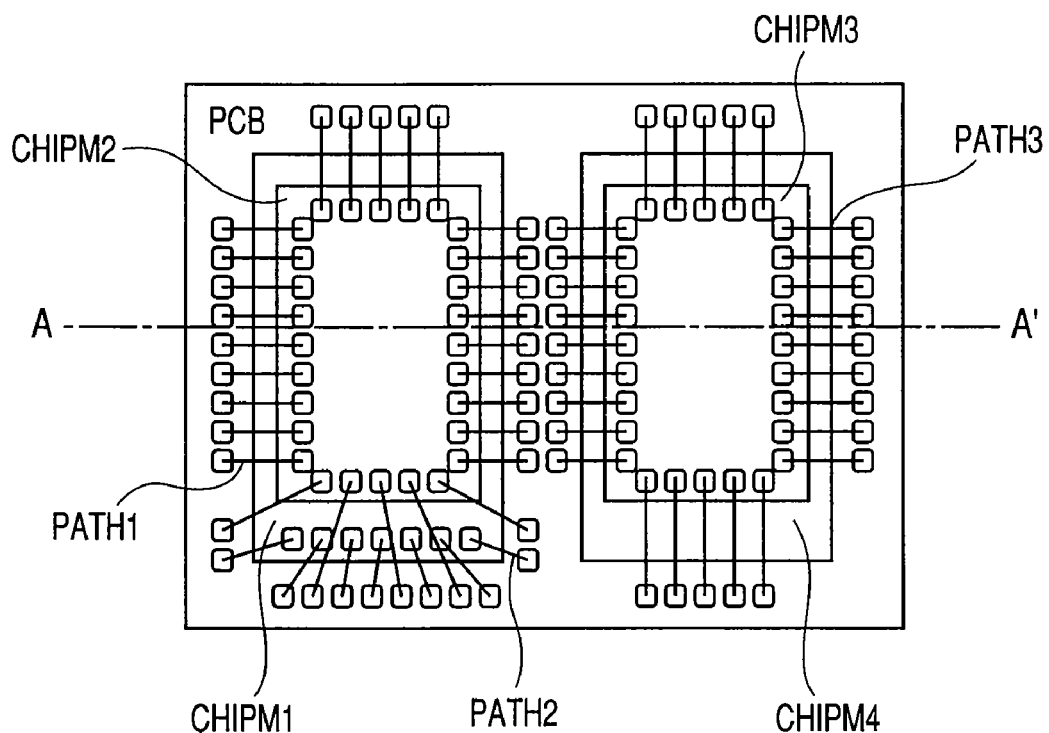
FIG. 24 is still another top view of the memory module mounted multi-chip module configured further differently from that shown in FIG. 23.
FIG. 24B is a cross sectional view taken on line A-A' of FIG. 24A.
Figure 24B:
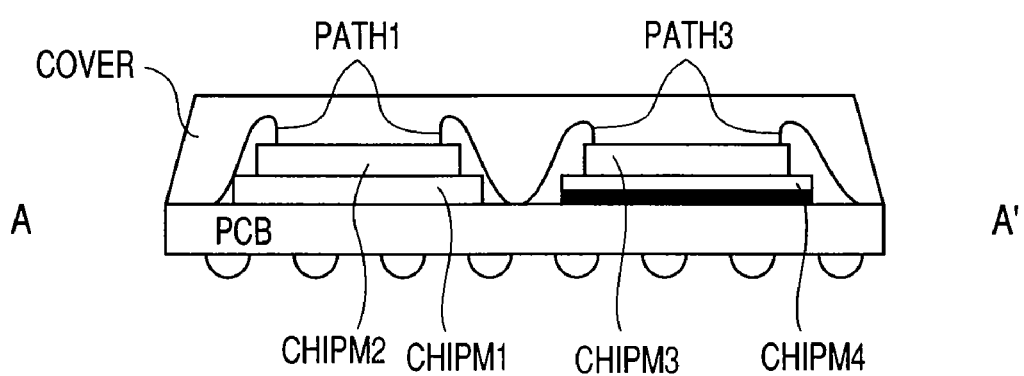

FIG. 24 shows a tenth embodiment of the memory system of the present invention. FIG. 24A shows a top view of the memory system and FIG. 24B shows a cross sectional view taken on line A-A' of FIG. 24A.

The memory system (memory module) in this embodiment includes CHIPM1, CHIPM2, CHIPM3, and CHIPM4 mounted on a substrate PCB (e.g., PCB made of a glass epoxy substrate). The substrate is mounted in the device with a ball grid array (BGA). If the CHIPM1 is a non-volatile memory, the CHIPM2 is a random access memory, the CHIPM3 is a control circuit, and the CHIPM4 is a CPU, this mounting method enables the memory system shown in FIG. 1 to be sealed in one package.

The CHIPM1 is connected to a bonding pad through a bonding wire (PATH2) on the substrate PCB and the CHIPM2 is connected to another bonding pad through another bonding wire (PATH1) on the substrate PCB. The CHIPM3 is connected to still another bonding pad through still another bonding wire (PATH3) on the substrate. A ball grid array is used to mount and wire the CHIPM4.

Because bear chips are mounted directly on a printed circuit board PCB in this embodiment, the memory module can be reduced in mounting area. Furthermore, because those chips are disposed closely to each another, the wiring between chips can be shortened. Because the bonding wire between the CHIPM4 and the substrate is omitted, the number of bonding wires can be reduced, thereby the number of fabricating processes can be reduced and the multi-chip module can be improved in reliability.

Eleventh Embodiment

Figure 25A:
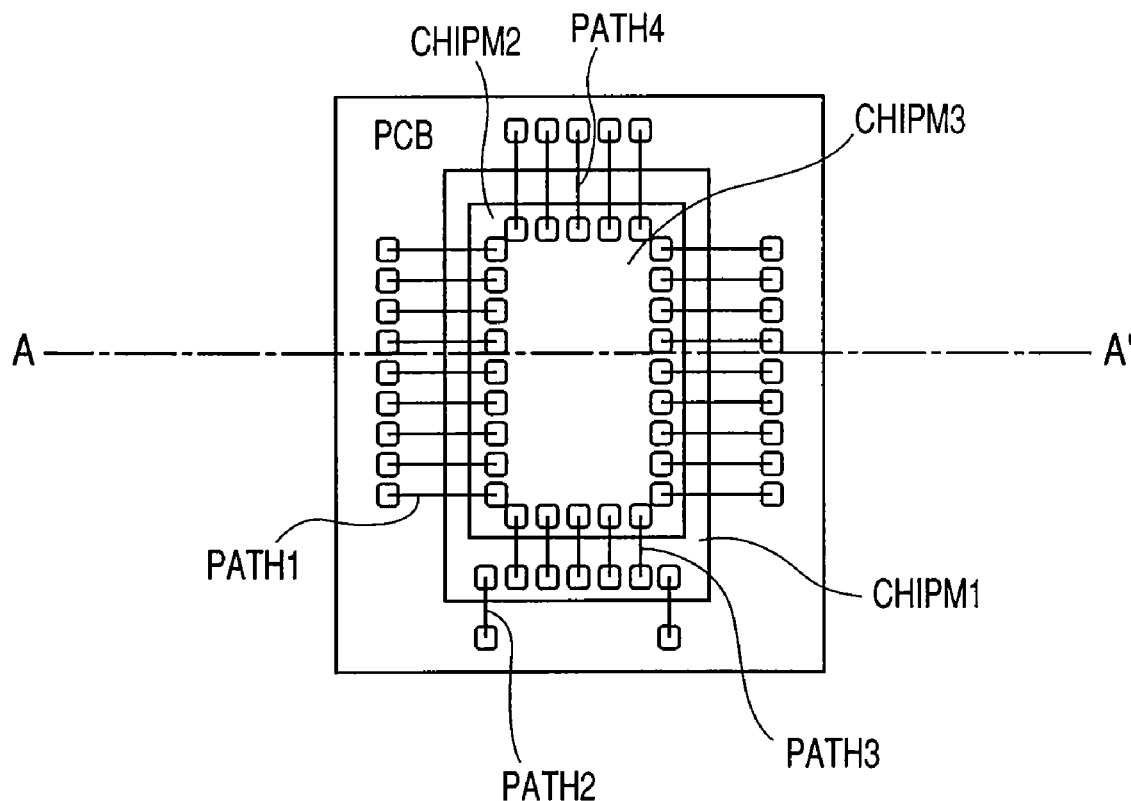
FIG. 25A is still another top view of the memory module mounted multi-chip module configured further differently from that shown in FIG. 24.
Figure 25B:
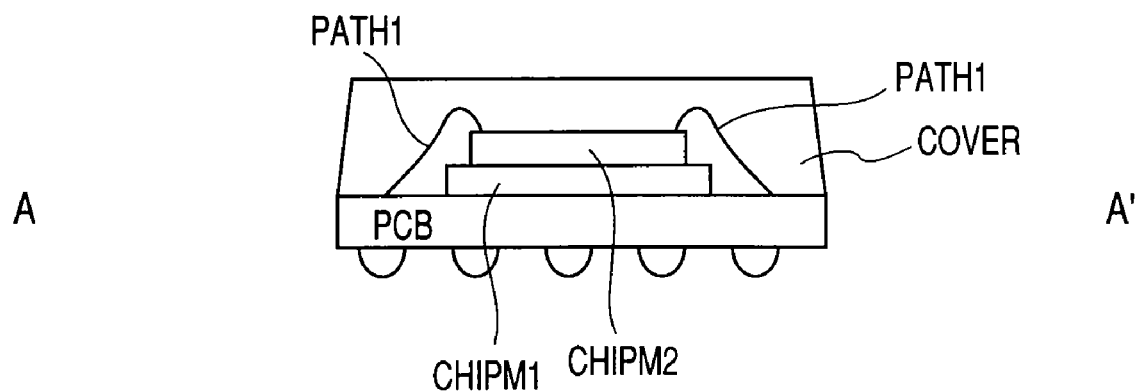
FIG. 25B is a cross sectional view taken on line A-A' of FIG. 25A.

FIG. 25 shows an eleventh embodiment of the multi-chip module of the present invention. FIG. 25A shows a top view of the multi-chip module and FIG. 25B shows a cross sectional view taken on line A-A' of FIG. 25A.

The multi-chip module in this embodiment includes CHIPM1, CHIPM2, and CHIPM3 mounted on the same substrate PCB (e.g., PCB made of a glass epoxy substrate). The substrate PCB is mounted in the device with a ball grid array (BGA). Although not limited specially here, if the CHIPM1 is a first non-volatile memory and the CHIPM2 is a control circuit that includes the first random access memory, this multi-chip module enables the memory module MEM2 shown in FIG. 11 and the memory module MEM3 shown in FIG. 12 to be sealed in one package.

Although not limited specially here, if the CHIPM1 is a memory that includes a first non-volatile memory and the CHIPM2 is a CPU, the memory system shown in FIG. 19 can be sealed in one package.

The CHIPM1 is connected to a bonding pad through a bonding wire (PATH2) on the substrate PCB and the CHIPM2 is connected to another bonding pad through another bonding wire (PATH1) on the substrate PCB. The CHIPM1 and the CHIPM2 are connected to each other through still another bonding wire (PATH3) on the substrate.

The chips mounted surface of the substrate PCB is resin-molded to protect those chips and their connecting wirings. The resin-molded surface can further be covered with metal, ceramic, or resin (COVER).

Because bear chips are mounted directly on a printed circuit board PCB in such a way in this embodiment, the memory module can be reduced in mounting area. Furthermore, because those chips are stacked, the wiring between each chip and the substrate can be shortened, thereby the chips mounting area can be reduced. And because the bonding wiring is employed for each connection between chips and between each chip and the substrate in a unified manner, the number of processes for fabricating the memory module can be reduced.

Furthermore, because each chip is connected to another directly through a bonding wire, the number of bonding pads and the number of bonding wires on the substrate can be reduced, thereby the number of processes for fabricating the memory module can be reduced. If the chips mounting surface is covered with resin, the memory module will become more strong in structure. If the chips mounting surface is covered with ceramic or metal, the memory module will become more improved in heat radiation and shielding effects in addition to the toughness in structure.

While the present invention has been described with reference to some embodiments, according to the present invention, the memory module consists of a non-volatile chip FLASH, a dynamic random access memory DRAM, and a control circuit and the memory module enables data transfer from the FLASH to the DRAM only with read operations; no writing from external is required. Thus the memory module can assure high security.

Furthermore, because the control circuit can hide the refresh operation carried out in the DRAM completely from external, the present invention can realize a NOR IF compatible, low cost, large capacity, and fast memory module.

And needless to say, this embodiment can be modified freely. For example, each circuit of the control circuit MCT1 can be omitted as needed. The capacity of the DRAM or SRAM can be set equally to or larger than that of the FLASH with no problem. This case has a merit that data can be transferred from the FLASH to the DRAM/SRAM in a given period, although the case has a large demerit in cost. Furthermore, if the FLASH is smaller in capacity than the DRAM/SRAM, every data can be transferred at the initialization time just after the power-on, so the merit of the present invention is small. On the other hand, if the FLASH is larger in capacity than the DRAM/SRAM, data transfer can be made as needed, so the merit of the present invention increases significantly.

What is claimed is:

1. A semiconductor device, comprising:
    a random access memory;
    a non-volatile memory;
    a control circuit connected to the random access memory and the non-volatile memory and used to control accesses to the random access memory and the non-volatile memory,
    wherein the semiconductor device further includes a first address area that stores data to be output in response to a read request received from external and a second address area provided outside the first address area;
    wherein the control circuit, upon receiving a read request issued to the first address area from external, outputs the requested data stored in the random access memory to external; and
    wherein the control circuit, upon detecting a read request received issued to the second address area from external, transfers the requested data stored in the non-volatile memory to the random access memory.

2. The semiconductor device according to claim 1, wherein the non-volatile memory includes a third address area that stores data to be transferred to the random access memory and a fourth address area that stores address information used to transfer data stored in the non-volatile memory to the random access memory.

3. The semiconductor device according to claim 1, wherein the data stored in the non-volatile memory is transferred to the random access memory in response to a read request issued to the second address area from external, then output to external from the random access memory in response to a read request received issued to the first address area from external.

4. The semiconductor device according to claim 1, wherein the data transfer to the random access memory from the non-volatile memory means transfer of error-corrected data.

5. The semiconductor device according to claim 4, wherein the non-volatile memory is a NAND type flash memory.

6. The semiconductor device according to claim 1, wherein the non-volatile memory further includes a fifth address area provided outside the third and fourth address areas and used to store a boot program; and
    wherein the control circuit, when the semiconductor device is powered on, reads the boot program.

7. The semiconductor device according to claim 1, wherein the random access memory is a static random access memory.

8. The semiconductor device according to claim 1, wherein the random access memory is a dynamic random access memory.

9. The semiconductor device according to claim 8, wherein the control circuit, upon receiving a read request issued to the first address area from external and upon refreshing the dynamic random access memory, carries out both refreshing the dynamic random access memory and reading the requested data from the dynamic random access memory during an access cycle time of the read request.

10. The semiconductor device according to claim 9, wherein the control circuit, upon receiving a read request issued to the dynamic random access memory from external while carrying out a background transfer that transfers data from the non-volatile memory to the dynamic random access memory, carries out both writing the data stored in the non-volatile memory to the dynamic random access memory and reading the requested data from the dynamic random access memory during a time of the access in response to the read request.

11. The semiconductor device according to claim 1, wherein the random access memory, the non-volatile memory, and the control circuit are integrated in one package.

12. The semiconductor device according to claim 1, wherein the random access memory and the control circuit are formed on one semiconductor chip.

13. The semiconductor device according to claim 1, wherein the random access memory, the control circuit, and the non-volatile memory are formed on one semiconductor chip.

14. The semiconductor device according to claim 1, wherein the control circuit, upon receiving a first read request issued to the second address area, transfers the requested data stored in the non-volatile memory to the random access memory in response to the address of a second read request that follows the first one.

15. The semiconductor device according to claim 1, wherein the control circuit further includes a background operation presetting circuit that holds transfer procedure data used to transfer data stored in the non-volatile memory to the dynamic random access memory.

16. The semiconductor device according to claim 15, wherein the transfer procedure data is stored in the non-volatile memory;
    wherein the transfer procedure data, when the semiconductor device is powered on, is transferred from the non-volatile memory to the background operation presetting circuit.

17. The semiconductor device according to claim 1, wherein the control circuit includes a boot buffer;
    wherein the boot buffer receives the boot program transferred from the non-volatile memory; and
    wherein the semiconductor device, when it is powered on, gets ready to output the boot program during data transfer from the non-volatile memory to the random access memory.

18. The semiconductor device according to claim 1, wherein the capacity of the non-volatile memory is larger than that of the random access memory.

* * * * *